United States Patent
Marks et al.

(10) Patent No.: US 9,385,332 B2
(45) Date of Patent: Jul. 5, 2016

(54) ORGANIC-INORGANIC HYBRID MULTILAYER GATE DIELECTRICS FOR THIN FILM TRANSISTORS

(71) Applicant: Northwestern University, Evanston, IL (US)

(72) Inventors: Tobin J. Marks, Evanston, IL (US); Young-geun Ha, Evanston, IL (US); Antonio Facchetti, Chicago, IL (US)

(73) Assignee: Northwestern University, Evanston, IL (US)

( * ) Notice: Subject to any disclaimer, the term of this patent is extended or adjusted under 35 U.S.C. 154(b) by 0 days.

(21) Appl. No.: 14/848,281

(22) Filed: Sep. 8, 2015

(65) Prior Publication Data

US 2016/0072085 A1    Mar. 10, 2016

Related U.S. Application Data

(62) Division of application No. 13/111,699, filed on May 19, 2011, now Pat. No. 9,276,226.

(51) Int. Cl.

| | |
|---|---|
| *H01L 51/05* | (2006.01) |
| *H01L 29/66* | (2006.01) |
| *H01L 29/24* | (2006.01) |
| *H01L 29/49* | (2006.01) |
| *H01L 29/51* | (2006.01) |
| *H01L 21/441* | (2006.01) |

(52) U.S. Cl.
CPC .......... *H01L 51/0533* (2013.01); *H01L 21/441* (2013.01); *H01L 29/24* (2013.01); *H01L 29/4908* (2013.01); *H01L 29/513* (2013.01); *H01L 29/517* (2013.01); *H01L 29/66969* (2013.01); *H01L 51/0529* (2013.01); *H01L 51/0537* (2013.01); *H01L 51/0545* (2013.01); *H01L 2251/301* (2013.01)

(58) Field of Classification Search
CPC ............ H01L 51/0529; H01L 51/0533; H01L 51/0537
See application file for complete search history.

(56) References Cited

U.S. PATENT DOCUMENTS

| | | | |
|---|---|---|---|
| 2004/0161873 A1 | 8/2004 | Dimitrakopoulos et al. | ... 438/99 |
| 2007/0284629 A1 | 12/2007 | Marks et al. | .................. 257/281 |
| 2008/0032301 A1 | 2/2008 | Rank et al. | ........................ 435/6 |
| 2009/0140243 A1 | 6/2009 | Kim et al. | ........................ 257/43 |
| 2009/0206341 A1 | 8/2009 | Marks et al. | .................... 257/66 |
| 2016/0035855 A1 | 2/2016 | Marks et al. | .................. 257/262 |

OTHER PUBLICATIONS

Katz et al: "Chromophore Structure, Second Harmonic Generation, and Orientational Order in Zirconium Phosphonate/Phosphate Self-Assembled Multilayers", *J. Am. Chem. Soc.*, 116: 6636-6640 (1994).
Hardy et al.: "Aqueous solution-gel preparation of ultrathin $ZrO_2$ films for gate dielectric application", *Thin Solid Films*, 516: 8343-8351 (2008).
Ha et al.: "Push-Pull π-Electron Phosphoric-Acid-Based Self-Assembled Multilayer Nanodielectrics Fabricated in Ambient for Organic Transistors", Chem. Mater., 21: 1173-1175 (2009).

*Primary Examiner* — Amar Movva
(74) *Attorney, Agent, or Firm* — Karen K. Chan

(57) ABSTRACT

Disclosed are organic-inorganic hybrid self-assembled multilayers that can be used as electrically insulating (or dielectric) materials. These multilayers generally include an inorganic primer layer and one or more bilayers deposited thereon. Each bilayer includes a chromophore or "π-polarizable" layer and an inorganic capping layer composed of zirconia. Because of the regularity of the bilayer structure and the aligned orientation of the chromophore resulting from the self-assembly process, the present multilayers have applications in electronic devices such as thin film transistors, as well as in nonlinear optics and nonvolatile memories.

16 Claims, 10 Drawing Sheets

A.

B.

A.

B.

C.

D.

ORGANIC-INORGANIC HYBRID MULTILAYER GATE DIELECTRICS FOR THIN FILM TRANSISTORS

CROSS REFERENCE TO RELATED APPLICATIONS

This application is a divisional of U.S. patent application Ser. No. 13/111,699, filed on May 19, 2011, which claims priority to and the benefit of U.S. Provisional Patent Application Ser. No. 61/346,250, filed on May 19, 2010, the disclosure of each of which is incorporated by reference herein in its entirety.

STATEMENT REGARDING FEDERALLY SPONSORED RESEARCH OR DEVELOPMENT

This invention was made with government support under Grant Number N00014-05-1-0541 awarded by the Office of Naval Research, Grant Number DMR-0520513 awarded by the National Science Foundation, and Grant Number FA9550-08-1-0331 awarded by the Air Force Office of Scientific Research. The government has certain rights in the invention.

BACKGROUND

Thin-film transistors (TFTs) fabricated from unconventional materials and by unconventional methodologies are of interest for future low-cost electronic applications such as RF-ID cards, flexible displays, and sensors. Transistors are the key components used for current modulation and switching in all modern electronic devices. The basic working principle of TFTs is that the channel source and drain current ($I_{DS}$) in saturation is modulated by the source-gate bias ($V_G$) according to Eq. 1:

$$I_{DS} = \frac{W}{2L} \mu C_i (V_G - V_T)^2 \qquad (1)$$

where W/L is the channel width/length, $C_i$ is the dielectric capacitance per unit area, $\mu$ is the charge carrier mobility, $V_G$ is the source-gate voltage, and $V_T$ is the threshold voltage. Depending on the charge carrier sign in the channel between source and drain, the semiconductor is either hole-(p-type) or electron-transporting (n-type). The two most important parameters governing TFT performance are the field-effect mobility ($\mu$) and the current on/off ratio ($I_{on}/I_{off}$). These parameters define the drift velocity of the charge carriers in the semiconductor layer under the source/drain electric field and the current modulation between the TFT "on" and "off" states upon a gate voltage change, respectively.

Over the past two decades, solution-processable organic, inorganic, and polymeric semiconductors were developed due to attractions such as printability, the possibility of large area fabrication, low-cost device fabrication, and compatibility with mechanically flexible substrates. Despite recent progress, one principal limitation of these semiconductors is their relatively low carrier mobilities, which are well below those of most silicon-based high-performance materials. As a result, TFTs fabricated from these semiconductors require high operating voltages to attain usable drain current ($I_{DS}$).

For low power applications such as RF-ID tags, flat panel displays, and portable electronics, it is important to achieve high TFT drain current ($I_{DS}$) at acceptably low operating voltages. Without changing device geometry (W and L) and semiconductor material ($\mu$), an alternative to overcome these mobility limitations is to increase the gate dielectric capacitance $C_i$ given by Eq. 2

$$C_i = \varepsilon_0 \frac{k}{d} \qquad (2)$$

From Eq. 2, it can be seen that operating bias reduction can be achieved by either increasing the dielectric constant (k) or decreasing the thickness (d) of the gate dielectric layer. An attractive approach is to employ high-k materials such as metal oxide (MO) films, however high-quality MO dielectric films typically require high growth/annealing temperatures (>400° C.) and/or expensive vacuum deposition technologies to ensure acceptably low leakage currents.

Organic-inorganic hybrid materials provide both the optical, electrical, and environmental durability of inorganic materials, as well as the mechanical flexibility and properties tunability of organic materials. Organic TFTs (OTFTs) using hybrid materials combining self-assembled monolayers (SAMs) with ultra-thin MO layers such as those of $HfO_x$, $AlO_x$, and $ZrO_x$ that operate at low voltages have been reported. However, the SAM thicknesses of these hybrid films is limited by the singly functionalized self-assembly precursors, and multilayers self-assembled from these reported precursors typically lack well-defined growth characteristics. A key to utilizing multilayered organic-inorganic hybrid materials in unconventional TFTs and other applications is the ability to prepare high-quality multilayers in the simplest and most reliable manner. Vapor-phase fabrication methods for organic-inorganic hybrid materials are promising approaches to high-quality hybrid films; however, they typically require high- or medium-vacuum deposition equipment (e.g., atomic layer or chemical/physical vapor deposition). As such, low-cost pathways for integrating these vapor-phase fabrication methods into large-volume coating processes are not obvious. Meanwhile, although layer-by-layer solution-based deposition of well-defined organic precursors allows the realization of a range of functional materials with a high degree of order and structural control at the molecular level, the precursors often are ambient-sensitive and highly reactive, which require anhydrous atmospheres and manipulation to control their chemistry.

Therefore, there is a need in the art for organic-inorganic hybrid multilayer dielectric materials that can be prepared at low temperatures reliably from reagents suitable for ambient atmosphere fabrication, and that can afford high capacitance values as well as low leakage currents.

SUMMARY

In light of the foregoing, the present teachings relate to methods for assembling an organic-inorganic hybrid multilayer dielectric material which can be performed at relatively low temperatures using reagents suitable for ambient atmosphere self-assembly, a process which can allow accurate control of film thickness. The resulting hybrid multilayer gate dielectrics can exhibit attractive physical properties including large-area uniformity and well-defined nanostructure, as well as desirable dielectric properties including high capacitance and low leakage currents. TFTs based on these dielectrics and a variety of organic and inorganic semiconductors can exhibit mobilities and current on/off ratios ($I_{on}/I_{off}$) comparable to those based on state-of-the art inorganic or organic dielectrics.

More generally, the present teachings provide electrically insulating (i.e., dielectric) multilayer materials, associated devices, and related methods of fabrication that can address various deficiencies and shortcomings of the prior art, including those outlined above.

The present organic-inorganic hybrid multilayer dielectric material generally includes an inorganic primer layer and one or more bilayers deposited thereon. Each bilayer includes a chromophore or "π-polarizable" layer and an inorganic capping layer comprising zirconia. The π-polarizable layer contains highly polarizable, "push-pull" π-electron compounds ("π-polarizable" compounds) that include a non-linear optical chromophore. The chromophore can include an azinylium ion. In various embodiments, the π-polarizable compound is heterobifunctionalized; at one end, a phosphonic acid terminal group allows formation of phosphonate bonds with the underlying zirconia layer, while functionalization of the other end with another hydrolyzable group allows coupling to the zirconia capping layer via non-phosphonate bonds. For example, the π-polarizable layer can include one or more π-polarizable compounds selected from:

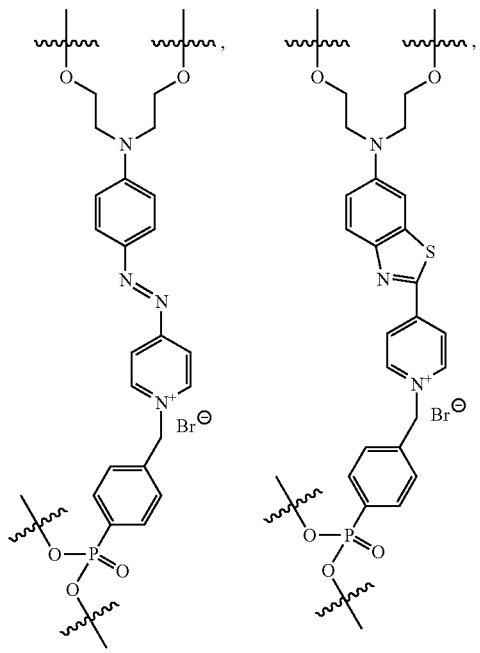

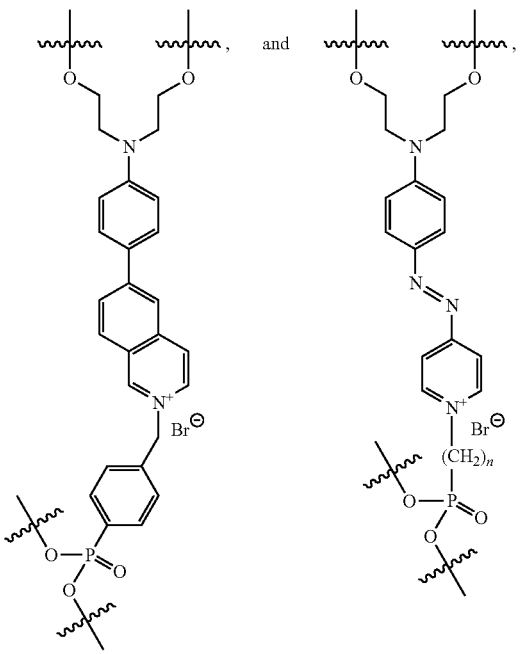

wherein n is an integer between 1 and 20.

Assembly of the present organic-inorganic hybrid multilayer dielectric material generally involves coupling the π-polarizable layer described herein to a first zirconia (underlying) layer, and coupling a second zirconia (capping) layer to the π-polarizable layer, thereby providing a bilayer. In some embodiments, two or more bilayers can be formed by repeating the two coupling steps in sequence. In certain embodiments, the present hybrid multilayer dielectric material is formed on a substrate, and the method can include forming an inorganic primer layer on the substrate. The substrate can be treated to provide hydroxyl groups on its surface. The primer layer can be composed of an inorganic oxide, which can be prepared by depositing (e.g., by spin-coating) a precursor sol on the substrate, followed by annealing at a temperature between about 100° C. and about 400° C. The precursor sol generally includes one or more inorganic oxide precursors such as metal alkoxides and metal chlorides, which undergo various forms of hydrolysis and polycondensation reactions. The precursor sol can include an organic solvent such as an alcohol. For example, the primer layer can be composed of zirconia ($ZrO_x$), which can be prepared by contacting the substrate with a zirconia sol that includes zirconium compounds such as $ZrCl_4$, $ZrOCl_2$, and $Zr(OR)_4$ (where each R independently can be a $C_{1-6}$ alkyl group) in an alcohol solvent. The precursor sol also can include a hydrolyzing catalyst.

To couple the π-polarizable layer to the primer layer, the primer layer-coated substrate can be contacted with a solution that includes one or more π-polarizable compounds. For example, the π-polarizable compounds can be selected from:

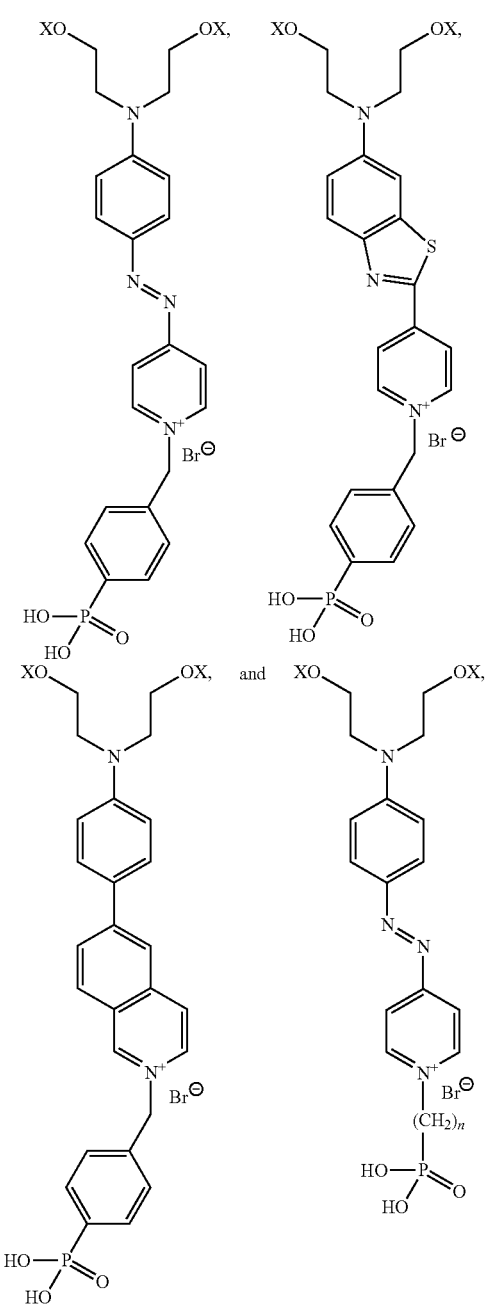

where X is H or a protecting group, and n is an integer between 1 and 20. The capping layer can be coupled to the π-polarizable layer using the same method for preparing a zirconia primer layer, i.e., depositing (e.g., by spin-coating) a zirconia sol on the π-polarizable layer, followed by annealing at a temperature between about 100° C. and about 400° C.

More generally, the inorganic oxide precursor sol and the organic precursor solution independently can include a solvent or solvent mixture comprising water and/or one or more organic solvents. For example, the solvent can be selected from water, an alcohol, an aminoalcohol, a carboxylic acid, a glycol, a hydroxyester, an aminoester, and a mixture thereof. In some embodiments, the solvent can be selected from water, methanol, ethanol, propanol, butanol, pentanol, hexyl alcohol, heptyl alcohol, ethyleneglycol, methoxyethanol, ethoxy-ethanol, methoxypropanol, ethoxypropanol, methoxybutanol, dimethoxyglycol, N,N-dimethylformamide, and mixtures thereof.

Each of the coupling steps of the present method can be performed by solution-phase deposition including printing (e.g., inkjet printing and various contact printing techniques such as screen-printing, gravure printing, offset printing, pad printing, lithographic printing, flexographic printing, and microcontact printing), spin-coating, drop-casting, zone casting, dip coating, blade coating, spraying, rod coating, or stamping. The annealing step can be carried out by various methods known in the art, for example, by using resistive elements (e.g., ovens), IR radiation (e.g., IR lamps), microwave radiation (e.g., microwave ovens), and/or magnetic heating.

The present multilayer assembly method can be performed under ambient atmosphere and can lead to highly ordered multilayer materials which show consistent electron density, surface roughness, and/or thickness. In various embodiments, the resulting multilayer films were found to have large electrical capacitance (>400 nF/cm$^2$), low leakage current densities (in the order of $10^{-6}$-$10^{-7}$ A/cm$^2$), and good thermal stability.

Accordingly, the present hybrid multilayers can be incorporated into various electronic devices as the dielectric component. Specifically, the desirable interfacial properties of the present hybrid multilayers render them compatible with diverse groups of semiconductor materials, including both p-type and n-type, and inorganic and organic semiconductors. Thin-film transistors fabricated with various inorganic and organic thin film semiconductors and the present hybrid multilayer as the dielectric material can exhibit high mobilities and current on/off ratios at low voltages (<±4.0 V).

The foregoing as well as other features and advantages of the present teachings will be more fully understood from the following figures, description, examples, and claims.

BRIEF DESCRIPTION OF DRAWINGS

It should be understood that the drawings described below are for illustration purposes only. The drawings are not necessarily to scale, with emphasis generally being placed upon illustrating the principles of the present teachings. The drawings are not intended to limit the scope of the present teachings in any way.

DETAILED DESCRIPTION

Throughout the application, where compositions are described as having, including, or comprising specific components, or where processes are described as having, including, or comprising specific process steps, it is contemplated that compositions of the present teachings also consist essentially of, or consist of, the recited components, and that the processes of the present teachings also consist essentially of, or consist of, the recited process steps.

In the application, where an element or component is said to be included in and/or selected from a list of recited elements or components, it should be understood that the element or component can be any one of the recited elements or components, or can be selected from a group consisting of two or more of the recited elements or components. Further, it should be understood that elements and/or features of a composition, an apparatus, or a method described herein can be combined in a variety of ways without departing from the spirit and scope of the present teachings, whether explicit or implicit herein.

The use of the terms "include," "includes", "including," "have," "has," "having," "contain," "contains,' or "containing" should be generally understood as open-ended and non-limiting unless specifically stated otherwise.

The use of the singular herein includes the plural (and vice versa) unless specifically stated otherwise. In addition, where the use of the term "about" is before a quantitative value, the present teachings also include the specific quantitative value itself, unless specifically stated otherwise. As used herein, the term "about" refers to a ±10% variation from the nominal value unless otherwise indicated or inferred.

It should be understood that the order of steps or order for performing certain actions is immaterial so long as the present teachings remain operable. Moreover, two or more steps or actions may be conducted simultaneously.

The present teachings, in part, provide self-assembled organic-inorganic multilayer dielectric materials that can be prepared layer-by-layer using solution-phase deposition methods under ambient atmosphere and where the resulting hybrid multilayer films possess desirable physical and dielectric properties. As used herein, "ambient atmosphere" refers to an atmosphere having the ambient temperature and pressure, and optionally, also a relatively low (e.g., less than about 10%) humidity.

Generally, the present hybrid multilayer dielectric materials can be prepared reproducibly using reagents well-suited for ambient atmosphere fabrication. Specifically, the multilayer dielectrics can be prepared using an inorganic oxide precursor and a phosphonic acid-based organic precursor.

Figure 1:
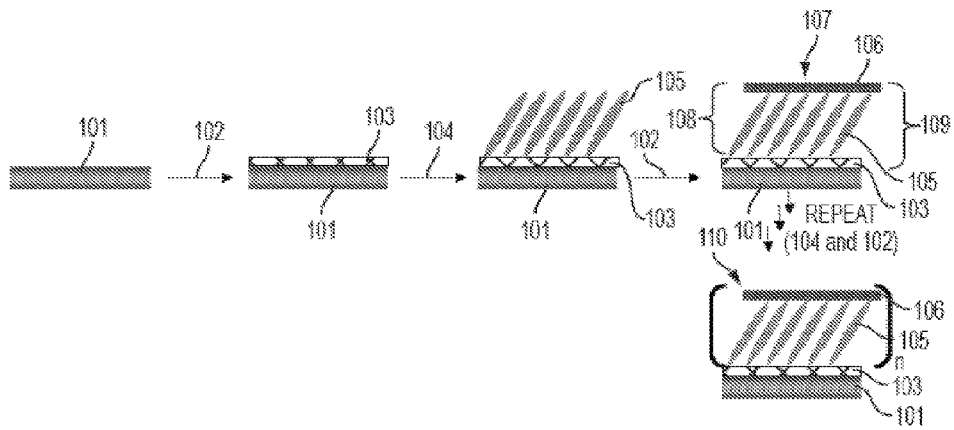
FIG. 1 is a schematic diagram that illustrates the fabrication of an organic-inorganic hybrid multilayer dielectric material (Zr-SAND multilayer) according to the present teachings.

FIG. 1 is a schematic diagram illustrating a fabrication procedure of the present organic-inorganic hybrid multilayer dielectric material (Zr-SAND multilayer). As illustrated, the fabrication of the Zr-SAND multilayers 110 involves forming an inorganic (e.g., $ZrO_2$) primer layer 103 on a substrate 101 (e.g., silicon wafer), followed by iterative deposition of an organic π-polarizable layer 105 and an inorganic oxide capping layer 106.

Referring to FIG. 1, a substrate 101 is contacted with an inorganic oxide precursor sol 102. After annealing, an inorganic oxide primer layer 103 is formed adjacent the substrate 101. The primer layer-substrate composite is then contacted with an organic precursor solution 104 that includes a π-polarizable compound to form a π-polarizable layer 105. Contacting the multilayer that includes the π-polarizable layer 105, the inorganic primer layer 103, and the substrate 101 with the precursor sol 102 again provides an inorganic oxide capping layer 106. Together, the above steps provide a multilayer 107 (Zr-SAND-1) that includes one bilayer 108 consisting of one inorganic capping layer 106 coupled to one π-polarizable layer 105. Illustrating with an embodiment where the organic π-polarizable layer 105 comprises 4-[[4-[bis(2-hydroxyethyl)amino]phenyl]diazenyl]-1-[4-(diethoxyphosphoryl)benzyl]pyridinium bromide as the π-polarizable compound, and inorganic layers that comprise $ZrO_x$, the bonding of the inorganic layer/π-polarizable layer/inorganic layer can be represented by:

the π-polarizable layer 105 is coupled to the inorganic oxide capping layer 106 via non-phosphonate bonds. Performing "n" cycles of first depositing the organic precursor solution 104 then depositing the inorganic oxide precursor sol 102 provides a multilayer 110 (Zr-SAND-n) that includes "n" bilayers 108.

In some embodiments, the inorganic oxide precursor sol can be prepared by dissolving a metal oxide precursor such as a metal chloride or a metal alkoxide in an organic solvent such as an alcohol. In certain embodiments, the precursor sol can be a zirconia sol which includes a zirconium compound such as $ZrCl_4$, $ZrOCl_2$, and/or $Zr(OR)_4$, wherein each R independently is a $C_{1-6}$ alkyl group. To accelerate hydrolysis, the precursor sol can include a hydrolyzing catalyst such as an acid. The inorganic oxide primer layer and/or capping layers can be deposited by spin-coating the precursor sol at a sufficient speed and for a sufficient period of time to achieve the desired thickness, followed by thermal curing at relatively low temperatures. For example, the annealing temperature can be less than about 400° C., less than about 300° C., or less than about 200° C. (e.g., about 150° C.). Typically, the thickness of the inorganic oxide capping layers is very thin (e.g., less than about 3 nm, and typically about 1 nm thick), whereas the inorganic oxide primer layer can be slightly thicker (e.g., about 2-5 nm thick).

The organic π-polarizable layer can be coupled to an underlying inorganic oxide layer by immersing (e.g., dipping) a substrate that includes the inorganic oxide layer in a solution of a suitable π-polarizable compound. The π-polarizable compound generally includes a non-linear optical chromophore which makes it highly polarizable. In various embodiments, the π-polarizable compound is heterobifunctionalized and includes a phosphonic acid group at one end. Exemplary π-polarizable compounds include

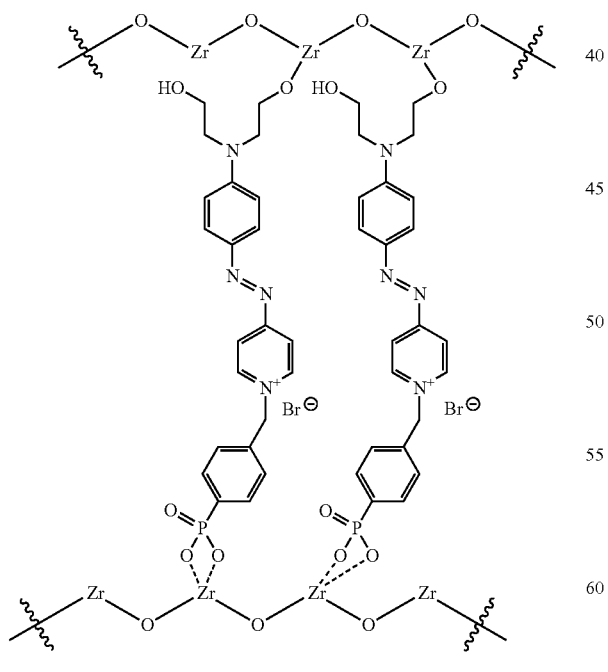

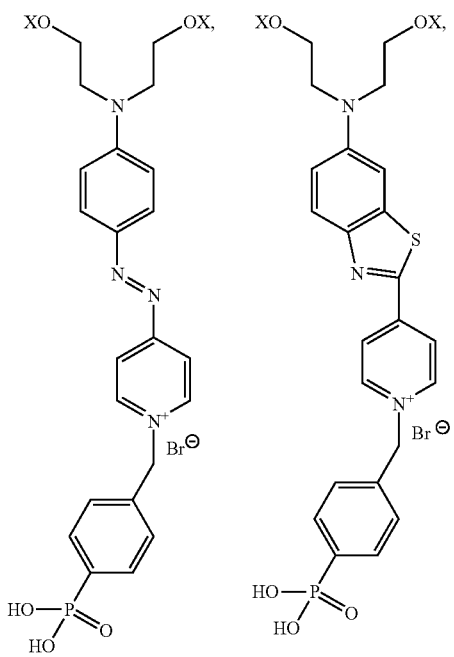

As shown, the inorganic oxide primer layer 103 is coupled to the π-polarizable layer 105 via phosphonate bonds, whereas -continued

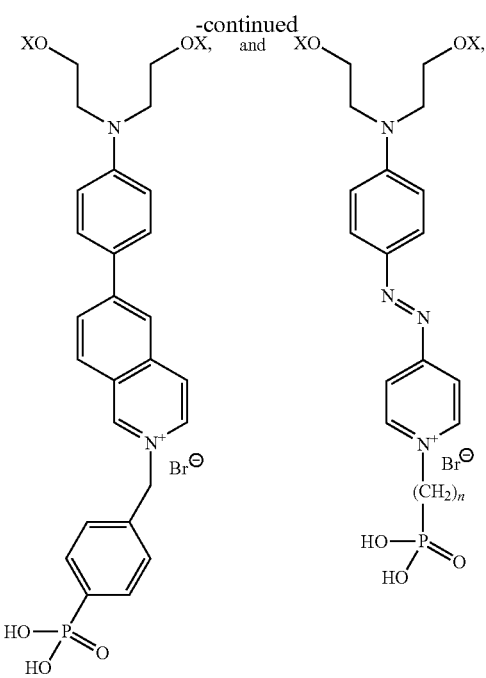

where X is H or a protecting group, and n is an integer between 1 and 20. In particular embodiments where the organic π-polarizable layer is prepared from the PAE precursor:

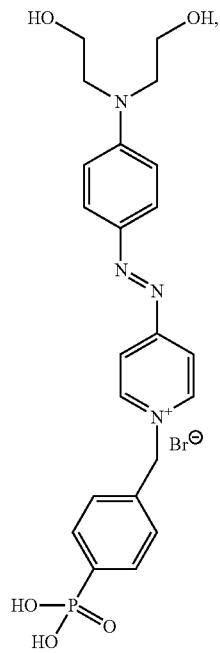

the π-polarizable layer has a typical thickness of about 1.5 nm. To illustrate further, multilayer dielectric materials according to the present teachings that include one to four bilayers can have a total thickness ranging from about 5 nm to about 12 nm.

The hybrid multilayer dielectric materials described herein can show well-defined growth characteristics including a high degree of order and structural control at the molecular level. The surface of the present multilayer film and the interfaces within the multilayer film can be very smooth, with typical surface roughnesses being less than 0.5 nm, even for multilayer films that include as many as four bilayers. The present organic-inorganic oxide hybrid multilayer dielectrics can exhibit superior dielectric properties (e.g., when compared to bulk inorganic oxide films), having capacitance as high as about to $750 \, nF \cdot cm^{-2}$, and leakage current densities as low as about $10^{-7} \, A \cdot cm^{-2}$. The present multilayer dielectrics also can show good thermal stability, making them compatible with diverse semiconducting and electrically conductive materials that may require high temperature processing.

In some embodiments, the present hybrid multilayer films can be further functionalized with an organic self-assembled monolayer to reduce their surface hydrophilicity. For example, the self-assembled monolayer can be assembled from an n-alkylphosphonic acid, where the phosphonic acid groups react with the inorganic oxide capping layer and the n-alkyl chains can be used to interact with an overlying organic layer (e.g., an organic semiconductor). In certain embodiments, the n-alkylphosphonic acid can have at least six carbon atoms. In particular embodiments, the n-alkylphosphonic acid can have at least ten carbon atoms.

The desirable dielectric and interfacial properties of the present hybrid multilayers can render them compatible with diverse groups of semiconductor materials (including both p-type and n-type, and both inorganic and organic semiconductors) and suitable as dielectric materials in various electronic devices. Thin-film transistors fabricated with various inorganic and organic thin film semiconductors and the present hybrid multilayer as the dielectric material can exhibit high mobilities and current on/off ratios while enabling significantly reduced operating voltages (<±4.0 V) compared with conventional $SiO_2$ dielectrics (±100V).

Figure 18:
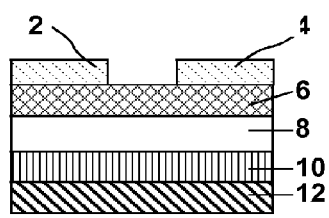
FIG. 18 illustrates four different configurations of thin film transistors (TFTs): (A) bottom-gate top contact, (B) bottom-gate bottom-contact, (C) top-gate bottom-contact, and (D) top-gate top-contact TFTs.
Figure 18:
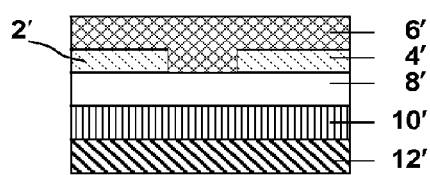
Figure 18:
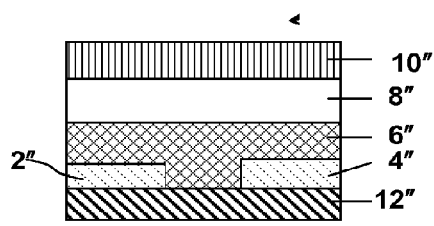
Figure 18:
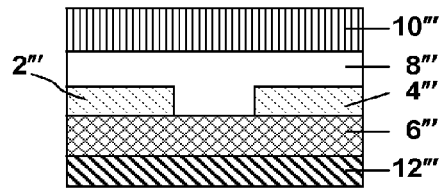

Accordingly, in one aspect, the present teachings can relate to a method of fabricating a thin film transistor. A thin film transistor can have different configurations as shown in FIG. 18, including (A) bottom-gate top-contact structure, (B) bottom-gate bottom-contact structure, (C) top-gate bottom-contact structure, and (D) top-gate top-contact structure. A thin film transistor generally includes a substrate (12, 12', 12", and 12'''), electrical conductors (source/drain conductors 2, 2', 2", 2''', 4, 4', 4", and 4'''), and gate conductors 10, 10', 10", and 10'''), a dielectric component 8, 8', 8", and 8''' coupled to the gate conductor, and a semiconductor component 6, 6', 6", and 6''' coupled to the dielectric on one side and in contact with the source and drain conductors on the other side. As used herein, "coupled" can mean the simple physical adherence of two materials without forming any chemical bonds (e.g., by adsorption), as well as the formation of chemical bonds (e.g., ionic or covalent bonds) between two or more components and/or chemical moieties, atoms, or molecules thereof.

The present methods of fabricating a thin film transistor can include assembling an organic-inorganic hybrid multilayer dielectric material as described herein, for example, on the gate electrode, and depositing a thin film semiconductor either directly adjacent to the organic-inorganic hybrid multilayer dielectric material or indirectly adjacent to the organic-inorganic hybrid multilayer dielectric material via an interlayer. The thin film semiconductor can be deposited by various methods known in the art, including both vapor-phase methodologies (e.g., atomic layer or chemical/physical vapor deposition) and solution-phase methodologies (e.g., printing, spin-coating, drop-casting, zone casting, dip coating, blade coating, spraying, rod coating, or stamping).

In some embodiments, the thin film semiconductor can be a metal oxide. Exemplary semiconducting metal oxides include indium oxide ($In_2O_3$), indium zinc oxide (IZO), zinc tin oxide (ZTO), indium gallium oxide (IGO), indium-gallium-zinc oxide (IGZO), tin oxide ($SnO_2$), and zinc oxide (ZnO). In certain embodiments, the metal oxide thin film semiconductor can be deposited by a solution-phase method.

In some embodiments, the thin film semiconductor can include one or more organic compounds, for example, one or more semiconducting molecules and/or polymers. Exemplary semiconducting molecules and polymers include various fused heterocycles, aromatic hydrocarbons (e.g., pentacene), polythiophenes, fused (hetero)aromatics (e.g., perylene imide and naphthalene imide small molecule or polymers), and other such organic semiconductor compounds or materials, whether p-type or n-type, otherwise known or found useful in the art. In various embodiments, the organic thin film semiconductor can be vapor-deposited, spin-coated, or printed. In embodiments where the thin film transistor is based upon an organic thin film semiconductor, the method can include assembling a monolayer between the organic-inorganic hybrid multilayer dielectric material and the organic thin film semiconductor. In certain embodiments, the self-assembled monolayer can be prepared with an n-alkylphosphonic acid precursor. In particular embodiments, the n-alkylphosphonic acid precursor can include at least six carbon atoms, for example, at least ten carbon atoms.

The method also can include forming source and drain electrodes in contact with the thin film semiconductor (e.g., deposited on top of the thin film semiconductor for top-contact structures, or deposited on top of the hybrid multilayer dielectric layer for bottom-contact structures). The gate electrode and the other electrical contacts (source and drain electrodes) independently can be composed of metals (e.g., Au, Ag, Al, Ni, Cu), transparent conducting oxides (e.g., ITO, IZO, ZITO, GZO, GIO, GITO), or conducting polymers (e.g., poly(3,4-ethylenedioxythiophene) poly(styrenesulfonate) (PEDOT:PSS), polyaniline (PANI), or polypyrrole (PPy)). For embodiments where the electrical contacts are composed of a metal, vacuum deposition can be used, typically through a shadow mask.

The substrate component for a thin film transistor can be selected from doped silicon, glass, aluminum or other metals alone or coated on a polymer or other substrate, a doped polythiophene, as well as polyimide or other plastics.

The following examples are provided to illustrate further and to facilitate the understanding of the present teachings and are not in any way intended to limit the invention.

Example 1

Synthesis of Phosphonic Acid-Based π-Electron Reagent

Various π-polarizable compounds that are suitable for use in the present π-polarizable layer can be synthesized according to techniques known to those skilled in the art from commercially available reagents.

Scheme 1 below illustrates a possible synthetic scheme of a representative phosphonic acid-based π-polarizable compound (4) or (PAE).

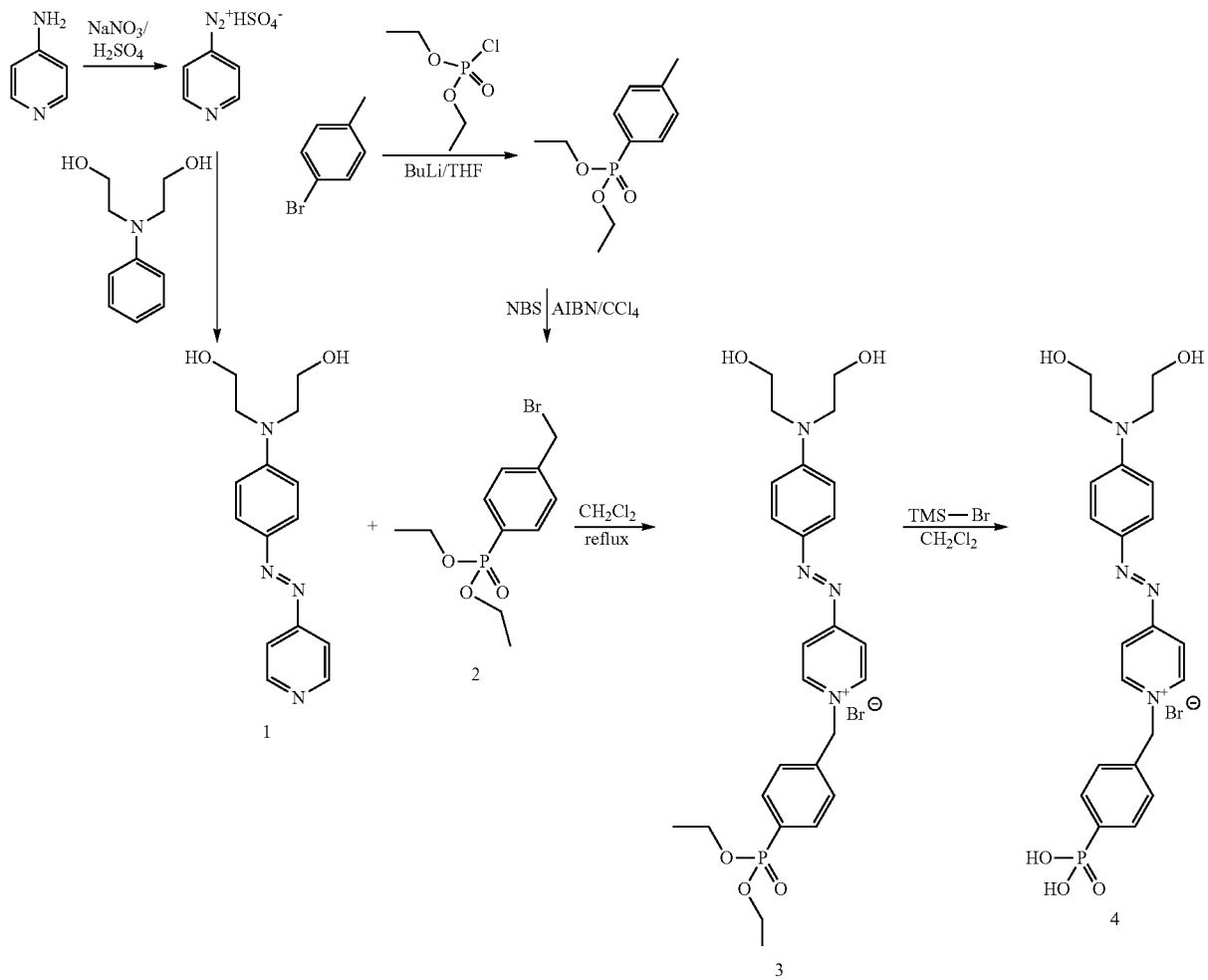

Scheme 1

Synthesis of 4-[[4-[N,N-bis(hydroxylethyl)amino]phenyl]azo]pyridine (1)

4-[[4-[N,N-Bis(hydroxylethyl)amino]phenyl]azo]pyridine (1) was prepared according to procedures described in Lin et al., *J. Am. Chem. Soc.*, 118: 8034 (1996). Specifically, pyridin-4-amine was reacted with a mixture of sodium nitrate and sulfuric acid, followed by reaction with 2,2'-(phenylazanediyl)diethanol.

Synthesis of diethyl 4-(bromomethyl)phenylphosphonate (2)

A solution of 1-bromo-4-methylbenzene (3.42 g, 20 mmol) in 140 mL of anhydrous THF was stirred at −78° C. under nitrogen and one equivalent of n-BuLi in hexane (1.6 M) was added. After 10 min, diethylchlorophosphate (3.45 g, 20 mmol) was added to the reaction mixture, and then stirring was continued for 1 hr. After reaching room temperature, the reaction mixture was extracted with ethyl ether (100 mL), then washed with aqueous NaHCO$_3$ (~1 g in 100 mL of H$_2$O). The organic layer was separated and concentrated to give a suspension of diethyl p-tolylphosphonate. $^1$H NMR (500 MHz, CD$_3$Cl): δ 7.70-7.74 (m, 2H), 7.28-7.30 (m, 2H), 4.06-4.15 (m, 4H), 2.42 (s, 3H), 1.31-1.34 (t, 6H).

To the suspension of diethyl p-tolylphosphonate (0.73 g, 3.2 mmol) was added a small amount of azobisisobutyronitrile (0.016 g, 0.1 mmol, in portions) and N-bromosuccinimide (0.57 g, 3.2 mmol) in anhydrous CCl$_4$ (30 mL). The mixture was refluxed for 4 h, then cooled to 10° C. and filtered to remove succinimide. The filtrate was washed with water (30 mL) and brine (30 mL) and then dried over anhydrous Na$_2$SO$_4$. After filtration, the crude product was obtained via evaporation of solvent and purified by chromatography on silica gel (hexene/ethyl acetate: 2/1 as eluent) to provide diethyl 4-(bromomethyl)phenylphosphonate as a colorless oil. $^1$H NMR (500 MHz, CD$_3$Cl): δ 7.79-7.83 (m, 2H), 7.50-7.52 (m, 2H), 4.51 (s, 2H), 4.09-4.18 (m, 4H), 1.33-1.36 (t, 6H).

Synthesis of 4-[[4-[bis(2-hydroxyethyl)amino]phenyl]diazenyl]-1-[4-(diethoxyphosphoryl)benzyl]pyridinium bromide (3)

A mixture of 4-[[4-[N,N-bis(hydroxylethyl)amino]phenyl]azo]pyridine (1) (0.286 g, 1.00 mmol, and 4-(bromomethyl)phenylphosphonate (2) (0.317 g, 1.00 mmol) was dissolved in CH$_2$Cl$_2$ (10 mL). The red mixture was heated under a nitrogen atmosphere at 60° C. for 4 h. The solvent was then removed under high vacuum and the residue was dried under high vacuum overnight. $^1$H NMR (500 MHz, DMSO-d$_6$): δ 9.07 (d, 2H, J$_{H-H}$=6 Hz), 8.14 (d, 2H, J$_{H-H}$=7 Hz), 7.90 (d, 2H, J$_{H-H}$=9.5 Hz), 7.76-7.80 (m, 2H), 7.62-7.64 (m, 2H), 7.07 (d, 2H, J$_{H-H}$=9.5 Hz), 5.88 (s, 2H), 4.95-4.97 (m, 2H), 3.99-4.03 (m, 4H), 3.99-4.03 (m, 4H), 3.66-3.72 (m, 8H), 1.22 (t, 3H). $^{31}$P NMR (400 MHz, DMSO-d$_6$): δ −18.07 (s, 1P). High resolution EI-MS: Calculated for C$_{26}$H$_{34}$N$_4$O$_5$P$^+$, 513.22744. Found, 513.22668.

Synthesis of 4-[[4-[bis(2-hydroxyethyl)amino]phenyl]diazenyl]-1-[4-(diethoxyphosphoryl)benzyl]pyridinium bromide (4)

To a solution of 4-[[4-[bis(2-hydroxyethyl)amino]phenyl]diazenyl]-1-(4-phosphonobenzyl)pyridinium bromide (3) (0.297 g, 0.5 mmol) in anhydrous CH$_2$Cl$_2$ (30 mL), trimethylbromosilane (10 eq., 0.66 mL) was added dropwise over 10 min. The mixture was then stirred overnight at room temperature under a nitrogen atmosphere. After completion of the reaction, the solvent was then evaporated and the residue was dissolved in methanol (5 mL). Filtration and evaporation of solvent afforded 0.29 g of the pure product (PAE) as a red powder. $^1$H NMR (500 MHz, DMSO-d$_6$): δ 9.05 (d, 2H, J$_{H-H}$=7 Hz), 8.12 (d, 2H, J$_{H-H}$=6.5 Hz), 7.90 (d, 2H, J$_{H-H}$=9.5 Hz), 7.70-7.74 (m, 2H), 7.55-7.57 (m, 2H), 7.10 (d, 2H, J$_{H-H}$=9.5 Hz), 5.04 (s, 2H), 3.65-3.74 (m, 8H). $^{31}$P NMR (400 MHz, DMSO-d$_6$): δ −12.83 (s, 1P). High resolution EI-MS: Calculated for C$_{22}$H$_{26}$N$_4$O$_5$P$^+$, 457.16408. Found, 457.16532.

Example 2

Zr-SAND Multilayer Film Fabrication

Hybrid multilayer films including only one bilayer (Zr-SAND-1) were fabricated by immersing a ZrO$_2$ primer layer-coated substrate in a 3 mM methanol solution of the phosphonic acid-based π-electron (PAE) reagent (Example 1) at about 60° C. for about 30 minutes, followed by rinsing with methanol. Then, the ZrO$_2$ interlayer was deposited by the same method used for the primer layer. Zr-SAND-2, 3, and 4 structures were formed by alternating repetition of the PAE and ultra-thin ZrO$_2$ bilayer depositions. PAE solutions can be reused multiple times without any noticeable detrimental effects on film quality.

Specifically, heavily doped n$^+$-silicon (Montco Silicon Technologies, Inc.) substrates were cleaned in EtOH (Aldrich, absolute, 200 proof) with sonication for 2 min and then dried with flowing nitrogen, followed by oxygen plasma treatment for 5 min to remove organic contamination and to improve wettability. A 0.01 M solution of zirconium (IV) chloride was prepared by dissolving the salt in ethanol (absolute >99.5%, Aldrich), followed by the addition of a mixture of nitric acid and DI water (molar ratio; ZrCl$_4$:HNO$_3$:H$_2$O=1:10:10). The resulting zirconium precursor solution was heated to 50° C. for 3 h to accelerate hydrolysis which leads to zirconium sol (Zr sol) formation. The dielectric organic-inorganic multilayer consists of a gate/substrate coated first of a primer inorganic layer (composed of, for example, zirconia or ZrO$_x$) and then of one or more periodic bilayers, where each bilayer consists of an organic layer (also referred herein as either a n-polarizable layer or a chromophore layer) and a capping layer (composed of zirconia or ZrO$_x$). The deposition of the primer layer was achieved by spin-coating the Zr sol at 5000 rpm for about 30 s on the gate/substrate, followed by curing at about 150° C. for about 20 min. This procedure was performed twice to complete the ZrO$_2$ primer layer. Next, for the deposition of the chromophore layer, the substrate with the primer layer was immersed in a solution of the phosphonic-acid based π-electron precursor (PAE; 3.0 mM in methanol) at about 60° C. for about 30 min. After rinsing with MeOH, the samples were dried under a nitrogen stream. Finally, the ZrO$_x$ capping layer was coupled to the chromophore layer by spin coating the same Zr sol at 5000 rpm for about 30 s on top of the chromophore layer, followed by thermal curing at about 150° C. for about 20 min. Fabrication of n-organic-ZrO$_x$ multilayers was achieved by "n" repetition of the last two steps. All Zr sol precursors were filtered through a 0.2 μm pore size PTFE membrane syringe filter prior to spin-coating, and were spin-coated under a controlled atmosphere of less than 10% relative humidity (measured with a Fisher Scientific Traceable Hydrometer-Thermometer-Dew Point probe).

Example 3

Zr-SAND Multilayer Film Characterization

The structural regularity of the Zr-SAND multilayers fabricated by the present iterative two-step process (PAE+ZrO$_2$ layer) (FIG. 1) was characterized by a full complement of physicochemical techniques: 1) transmission optical spectroscopy (UV-Vis) to characterize assembly chemistry and microstructural regularity, 2) X-ray reflectivity (XRR) to characterize film thickness, density, and interfacial roughness, 3) transmission electron microscopy (TEM) to characterize film thickness and microstructural regularity, and 4) atomic force microscopy (AFM) to characterize surface morphology and roughness.

Optical absorption spectra were acquired with a Varian Cary 5E spectrophotometer. Film thicknesses of the multilayer films were analyzed by X-ray reflectivity (XRR) using wavelength λ=0.1541 nm CuKα radiation at an 18 kW Rigaku ATX-G Thin-film Diffraction Workstation. The structural details of the electron density profile were obtained by fitting the XRR data to a multilayer model calculated by the Abeles Matrix method (see e.g., Parratt, *Phys. Rev.*, 95: 939 (1954); and Nelson, *J. Appl. Crystallogr.*, 39: 273 (2006)). Each bilayer, n, is defined by its thickness, $d_n$, electron density, $\rho_n$, interface roughness, $\sigma_n$, to generate a complete electron density profile (ρ(z)). Four kinds of multilayer systems were analyzed: Zr-SAND-n, where "n" is the number of bilayers and n=1, 2, 3, and 4. Zr-SAND-1 was modeled as 3 slabs (primer ZrO$_2$ layer, PAE layer, and ZrO$_2$ interlayer) with a Si substrate and an air superstrate. For thicker multilayers, two slabs were added to model each additional layer, corresponding to the organic and inorganic components. Interparameter constraints and batch-fitting procedures were employed in order to reduce the number of free parameters, limit solutions to a physically reasonable range, and enforce structural consistency between multilayer models. Cross-sectional TEM samples were prepared and imaged using a JEOL-2100F scanning/transmission electron microscope (S/TEM) and a Hitachi HD-2300A scanning electron microscope (STEM), with both bright-field (BF) and high-angle annular dark-field (HAADF) detectors. The morphologies of all thin films were evaluated by atomic force microscopy (AFM) using a JEOL-5200 scanning probe microscope with silicon cantilevers in the tapping mode.

Figure 2:
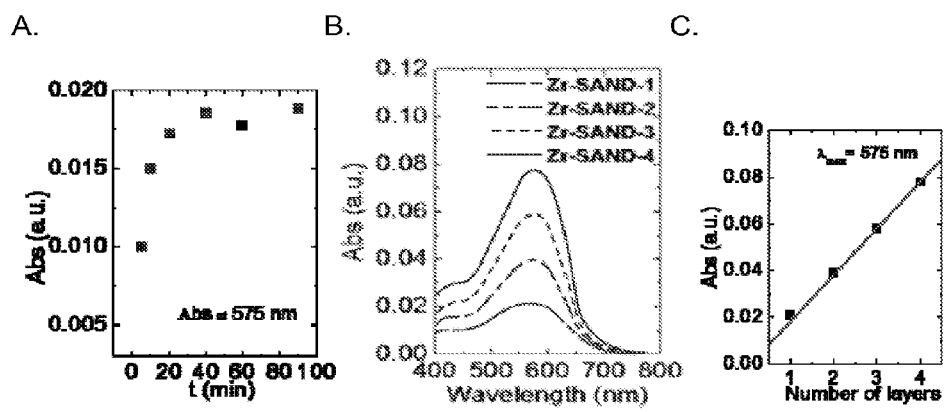
FIG. 2 shows (A) optical spectroscopic data as a function of reaction/deposition time for optimizing the formation of a single π-polarizable layer (a chromophore monolayer), (B) UV-vis absorption spectra of Zr-SAND-1, Zr-SAND-2, Zr-SAND-3, and Zr-SAND-4, and (C) optical absorption spectra of Zr-SAND-n at 575 nm as a function of the number of bilayers (Zr-SAND-1, Zr-SAND-2, Zr-SAND-3, and Zr-SAND-4).

The deposition kinetics of the π-polarizable compound (PAE) from MeOH solution onto substrates were monitored by UV-vis spectroscopy to optimize reaction conditions. FIG. 2A shows the deposition kinetics at 60° C. The PAE optical transition at 575 nm reaches at maximum after 30 min at 60° C., and longer reaction times result in a constant absorption, meaning that a densely packed molecular assembly of PAE is achieved. No other bands or shifts in the optical absorbance maxima are observed, arguing against significant chromophore aggregation or decomposition (FIG. 2B). Furthermore, the UV-vis measurements unambiguously demonstrate a linear dependence of the HOMO-LUMO CT chromophore optical absorbance at 575 nm on Zr-SAND-1 to 4, demonstrating that essentially equal quantities of uniformly aligned chromophore units are incorporated in each sublayer up to Zr-SAND-4 bilayers.

Figure 3:
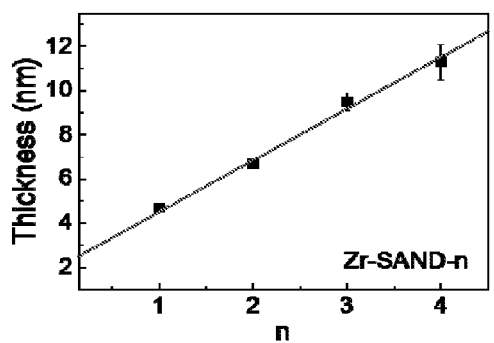
FIG. 3 shows specular X-ray reflectivity (XRR)-derived film thickness (nm) data as a function of the number of bilayers, n, in the multilayer films Zr-SAND-1 to 4 as prepared according to the present methods. The solidline is the fit by linear regression, indicating an average bilayer thickness of about 2.4 nm.

X-ray reflectivity (XRR) data (not shown) exhibit the classical Kiessig fringes expected from similar organic-inorganic hybrid multilayers with alternating low- and high-electron density layers. See Malik et al., *J. Chem. Phys.*, 107: 645 (1997). Analysis was performed as a function of out-of-plane scattering vector q=4π sin θ/λ, with least-squares best-fit models calculated with Abeles (see Parratt, *Phys. Rev.*, 95: 359 (1954) and Nelson, *J. Appl. Crystallogr.*, 39: 273 (2006)) matrix method using the Motofit software package (Nelson). Easily observable from the XRR data is the emergence of the first-order multilayer Bragg peak at q=~2.65 nm$^{-1}$ (d=~2.35 nm) as the number of layers increases. The extracted electron density profiles, normalized to $\rho_{Si}$, reveal highly ordered multilayers which are consistent from sample to sample in terms of electron density, roughness, and thickness. Well-defined ZrO$_2$/PAE layer progressions are evident from the strong oscillations in the electron density profile. Additionally, all the ZrO$_2$ and PAE interfaces are at comparable positions in z from sample to sample, indicating highly controlled, sequential deposition. The total thicknesses of the Zr-SAND-1, 2, 3 and 4 films are found to be 4.7±0.1, 6.7±0.1, 9.5±0.2, and 11.3±0.8 nm, respectively, as derived from the individual electron density profiles themselves (see Fukuto et al., *J. Chem. Phys.*, 119: 6253 (2003)), and increase linearly with increasing numbers of bilayers, n, (FIG. 3). A linear fit of the thickness as a function of n linear regression reveals an average bilayer (PAE+ZrO$_2$ interlayer) thickness of 2.4±0.1 nm, with $d_{PAE}$:$d_{ZrO2}$~1.6:1 and the ZrO$_2$ primer layer thickness of 2.1±0.2 nm. The electron density minima in the electron density profiles correspond to the organic PAE layer and are found to be approximately that of bulk Si; however this value is artificially high because the interface roughnesses are on the order of the PAE layer thickness. The ZrO$_2$ layers have electron densities that are nearly twice that of bulk Si, but it is possible to see the effects of the interface roughness in the reduced electron densities of the thinner ZrO$_2$ layers deposited on the PAE compared to that of the ZrO$_2$ base layer. Finally, interfaces were found to have RMS roughnesses of less than 0.5 nm from the data fitting.

Figure 4:
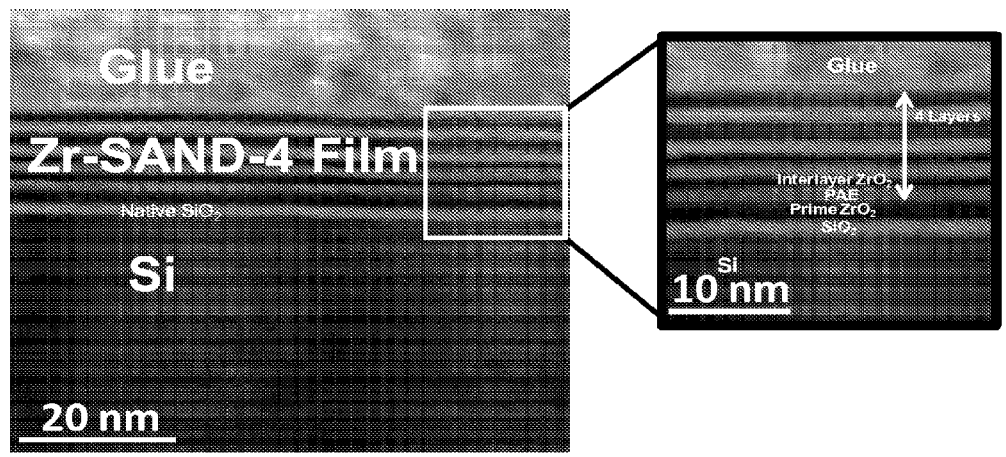
FIG. 4 shows a cross-section TEM image of the Si/Zr-SAND-4 film interface. The label indicates the layer identities.
Figure 5:
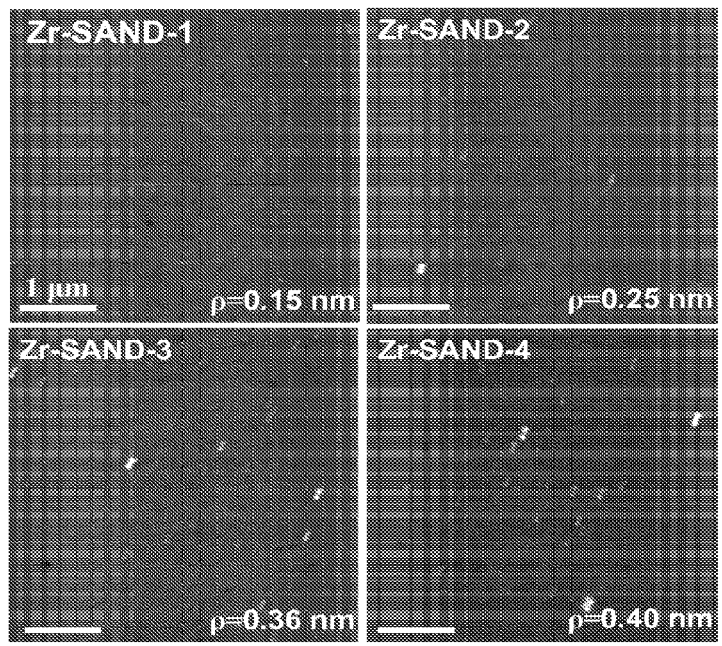
FIG. 5 shows AFM images at 5×5 μm scan area of Zr-SAND-1 to 4 films. The space bar indicates 1 μm, and ρ is rms roughness.

A cross-sectional high-angle annular dark-field scanning transmission electron microscopy (HAADF STEM) image of Zr-SAND-4 (FIG. 4) reveals a continuous and uniform contrast for the individual phases, which provides direct observation of the superlattice structures and confirms the expectations for the individual PAE and ZrO$_2$ layers in the multilayer film structure. The primer ZrO$_2$ is ~2 nm thick on top of native Si oxide layer (as expected by the double coating) and the PAE layer thickness is 1.5±0.1 nm, in agreement with the computed molecular lengths and previous results. See Zhu et al., *Chem. Mater.*, 14: 4982 (2002) and Lin et al., *J. Am. Chem. Soc.*, 119: 2205 (1997). The subsequent top ZrO$_2$ layer is ~1 nm thick. The thicknesses of the Zr-SANDs can be controlled by adjusting the number of PAE and ultrathin ZrO$_2$ bilayers. The measured thickness of ~12 nm for Zr-SAND-4 from the TEM images is in good agreement with the aforementioned XRR results. Atomic force microscopy (AFM) images (FIG. 5) of the Zr-SAND-1 to 4 films demonstrate continuous, crack/pinhole-free surface morphologies (maximum root-mean-square (RMS) roughness of ~0.5 nm).

Example 4

Dielectric Properties of Zr-SAND Multilayer Films

To assess the dielectric properties of the Zr-SAND multilayer films, Metal-Insulator-Semiconductor (MIS) sandwich structure devices were fabricated by thermal Au electrode deposition (dimension: 200 μm×200 μm) on Zr-SAND-coated n$^{++}$-Si substrates. For this example and Example 5, MIS direct current measurements were carried out under ambient conditions using a Signatone probestation interfaced to a Keithley 6430 Sub-Femtoamp Remote Source Meter and a Keithley 2400 source meter with a locally written Lab- VIEW program. An impedece analyzer (HP 4192A) was used for capacitance measurements.

Figure 6:
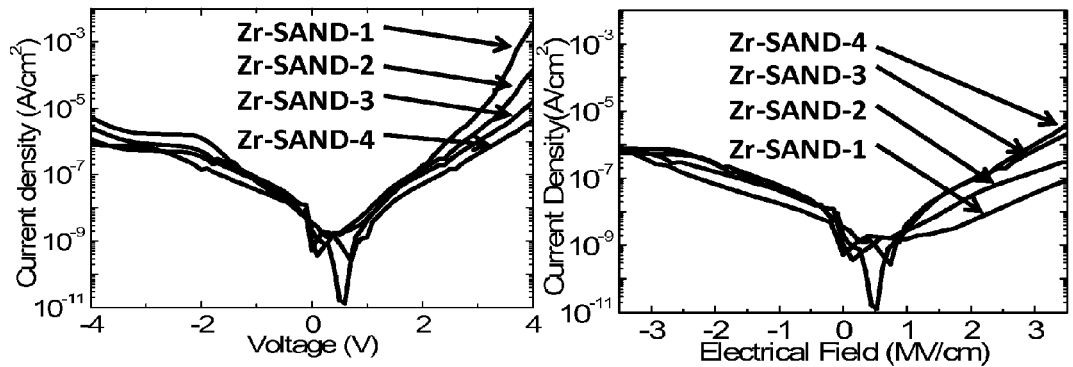
FIG. 6 shows representative (A) current-density versus voltage (J-V) and (B) current-density versus electric field (J-E) plots for MIS structures fabricated with the present Zr-SAND multilayers with four different thicknesses (Zr-SAND-1, Zr-SAND-2, Zr-SAND-3, and Zr-SAND-4).

FIG. 6 shows typical current density versus voltage (J-V) and current density versus electric field (J-E) plots for MIS structures fabricated with four different thicknesses (Zr-SAND-1, 2, 3, and 4). The leakage current density of these films progressively decreases for the same applied voltage (±4V) as the number of layers is increased due to the increased thickness. However, the leakage current density for the same electric field increases with the number of layers, then saturates at ~$10^{-7}$ A/cm$^2$ at 2 MV/cm beyond Zr-SAND-3. The lower leakage current density for Zr-SAND-1 or -2 versus the thicker films appears to arise from synergistic effects involving additional leakage barriers such as those provided by the native oxide and the ZrO$_2$ primer layer. Nonetheless, this effect is reduced with increasing layer numbers because the contribution of the additional leakage barrier becomes negligible as the dielectric thickness is increased. It is important to note that the leakage current densities of the combined PAE+ZrO$_2$ hybrid films observed here are at least 10 times lower (<1×$10^{-6}$ A/cm$^2$, 2 MV/cm) than the reported leakage current densities of bulk ZrO$_2$ films (~1×$10^{-5}$ A/cm$^2$, 2 MV/cm) prepared by sol-gel methods at the same processing temperature (150° C.). See Ha et al., *J. Am. Chem. Soc.*, 132: 17426 (2010).

Figure 7:
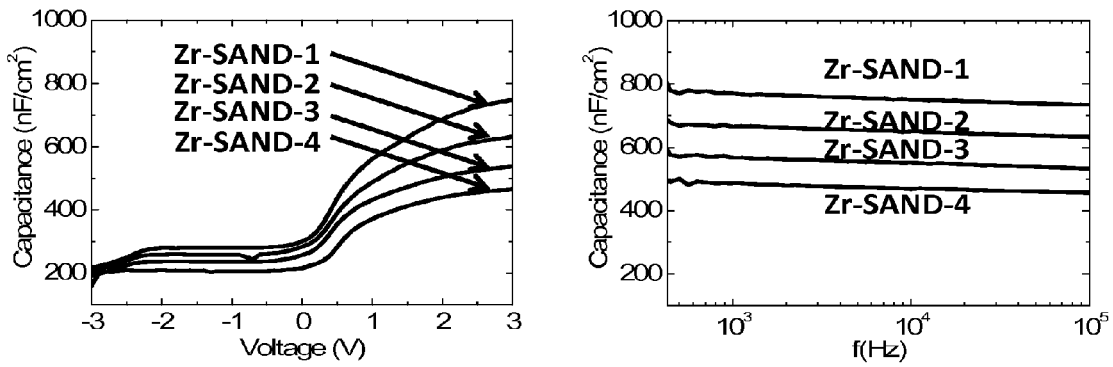
FIG. 7 shows (A) capacitance versus voltage plots measured at 10 kHz for MIS structures fabricated with the present Zr-SAND multilayers with four different thicknesses (Zr-SAND-1, Zr-SAND-2, Zr-SAND-3, and Zr-SAND-4), and (B) capacitance versus frequency plots measured at 3.0 V for Zr-SAND-1, Zr-SAND-2, Zr-SAND-3, and Zr-SAND-4.

Capacitance-frequency (C-f) measurements were performed on the MIS structures and the measured capacitances are 750 (Zr-SAND-1), 633 (Zr-SAND-2), 535 (Zr-SAND-3), and 465 nF/cm$^2$ (Zr-SAND-4) at 10 kHz (FIG. 7). As the number of layers is increased, the capacitance values decrease due to the increased thickness. The multilayer dielectric in the n$^{++}$-Si/Zr-SAND [primer ZrO$_2$/(PAE/interlayer ZrO$_2$)$_n$, n (the number of bilayer)=1, 2, 3, and 4]/Au MIS devices can be modeled as capacitors in series, according to Eq. 3:

$$\left(\frac{1}{C_i}\right) = \left(\frac{1}{C_{SiO_2}} + \frac{1}{C_{p\text{-}ZrO_2}}\right) + n \cdot \left(\frac{1}{C_{PAE}} + \frac{1}{C_{i\text{-}ZrO_2}}\right) \quad (3)$$

where n is the number of bilayers, SiO$_2$ is the native oxide on the Si wafer, p-ZrO$_2$ is the ZrO$_2$ primer layer, i-ZrO$_2$ is the ZrO$_2$ interlayer, and PAE is the phosphonic-acid based π-electron layer. The capacitances of the native oxide and ZrO$_2$ primer layer on the Si bottom electrode are 1380 and 4425 nF/cm$^2$, respectively, assuming a 2.5 nm thick SiO$_2$ (k=3.9) and 2 nm thick ZrO$_2$ layer (k=10) (see Ha et al., *J. Am. Chem. Soc.*, 132: 17426 (2010)), respectively. From the accumulation regime capacitances, the C$_i$ of the each Zr-SAND is measured as 465-750 nF/cm$^2$ at 10 kHz, yielding a PAE dielectric constant of ~7 for the entire multilayer structure. Plotting the reciprocal value of C$_i$ vs. Zr-SAND-n (n=1, 2, 3, and 4) shows a linear increase with the number of bilayers, which supports a regularly defined multilayer structure.

TABLE 1

Summary of Film and Dielectric Properties for Zr-SAND- 1 to 4 Films

| | Thickness (nm) | Roughness (nm) | J (A/cm$^2$) at 2 MV/cm | C$_i$ (nF/cm$^2$) |
|---|---|---|---|---|
| Zr-SAND- 1 | 4.7 ± 0.1 | 0.15 | 7 × $10^{-8}$ | 750 |
| Zr-SAND- 2 | 6.7 ± 0.1 | 0.25 | 2 × $10^{-7}$ | 633 |
| Zr-SAND- 3 | 9.5 ± 0.2 | 0.36 | 3 × $10^{-7}$ | 535 |
| Zr-SAND- 4 | 11.3 ± 0.8 | 0.40 | 3 × $10^{-7}$ | 465 |

Example 5

Thermal Stability of Zr-SAND Multilayer Films Under High Annealing Temperature Conditions The thermal stability of the Zr-SAND multilayers was investigated in MIS capacitor structures. The n$^+$-Si/Zr-SAND substrates were thermally annealed at 400° C. for 5 min in air, and Au dot contacts were then thermally evaporated through a shadow mask (200×200 mm$^2$). The annealing temperature was selected based on the fact that most metal oxide thin film semiconductor (such as zinc tin oxide ZTO) require a processing temperature of 400° C. or above.

Figure 8:
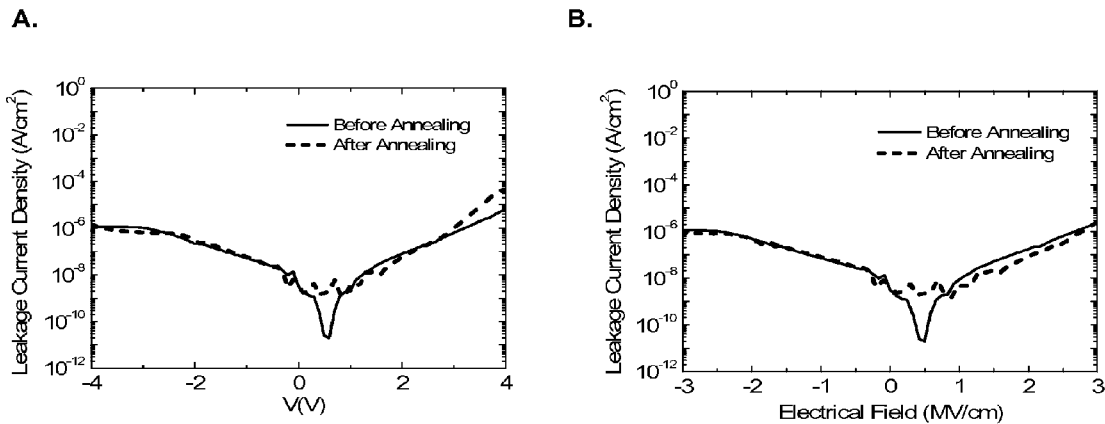
FIG. 8 compares (A) the current-density versus voltage (J-V) plots and (B) the current-density versus electric field (J-E) plots for MIS structures fabricated with a Zr-SAND-4 multilayer and representative thermally annealed Zr-SAND-4 multilayers, respectively.

The leakage current density (J$_{leak}$) versus voltage (or electric field) and capacitance versus voltage (or frequency) of the control Zr-SAND-4 and thermally annealed Zr-SAND-4 were measured in the same bias window (−4 to +4V) (FIG. 8). Compared to the control Zr-SAND-4 film (~6×$10^{-6}$ A/cm$^2$ at 4 V), the leakage current density increases slightly at the same applied voltage, after annealing at 400° C. in air (~3×$10^{-5}$ A/cm$^2$ at 4V). The capacitance of the Zr-SAND-4 film likewise increases as the annealing temperature is increased, from 465 (control) to 650 nF cm$^2$ (400° C.).

Figure 9:
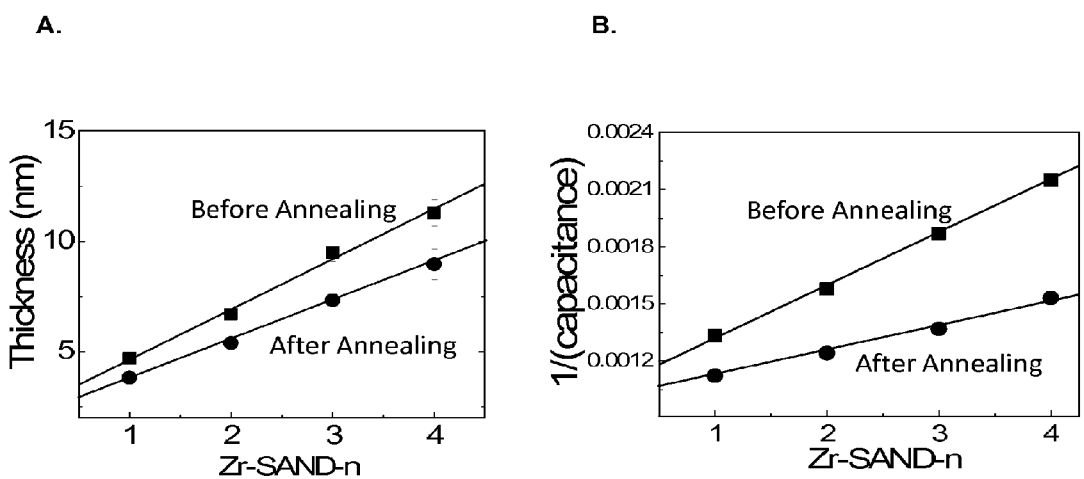
FIG. 9 shows (A) specular X-ray reflectivity (XRR)-derived film thickness (nm) data as a function of the number of bilayers, n, in the control Zr-SAND-4 multilayer versus thermally annealed Zr-SAND-4 multilayers and (B) the inverse of capacitance versus the number of Zr-SAND bilayers for the control Zr-SAND-4 multilayer and thermally annealed Zr-SAND-4 multilayers.

To further understand leakage current and capacitance variation during annealing, the microstructure of Zr-SAND-4 before annealing at high temperature and after thermally annealing at 400° C. was investigated by X-ray reflectivity (XRR). The XRR data and the extracted electron density profiles for control Zr-SANDs and high-temperature annealed Zr-SANDs reveals that the highly ordered multilayer structure persists after thermal annealing at 400° C. However, compared to the control Zr-SAND films, the thicknesses are reduced upon thermal annealing by as much as 20% versus the control Zr-SAND film (FIG. 9A). This contraction is similar to that in silane-based conventional SAND dielectric films. See Byrne et al., *Adv. Mater.*, 20: 2319 (2008). It was noted that while the film becomes thinner and denser after thermal annealing, the microstructural data and reciprocal C$_i^{-1}$ vs. Zr-SAND-n (n=1, 2, 3, and 4) plot (FIG. 9B) demonstrates that well-defined superlattice structures are preserved in the high temperature annealing. Therefore, the increased capacitance is reasonably associated with the decreased Zr-SAND film thickness. Also, it was noted that the leakage current density increases slightly after 400° C. annealing for the same bias window and this increase may simply reflect the film thickness reduction. FIG. 8B plots the leakage current density versus electric field, demonstrating the similar behavior of the leakage current density at the same electric field between control and thermal annealed Zr-SAND-4 film. These results provide clear evidence that nanoscopic SAND films exhibit remarkable thermal and dielectric stability under ambient, rendering them suitable for high-temperature film growth/annealing processes.

Example 6

Fabrication and Characterization of Thin-Film Transistors Using Organic or Inorganic Semiconductors on Zr-SAND Mutilayer Films TFTs were fabricated with representative organic (pentacene; P5) and inorganic (zinc tin oxide; ZTO) semiconductors on Zr-SAND multilayers by vacuum vapor deposition and spin-coating, respectively.

Specifically, bottom gate/top contact organic TFTs were fabricated by vacuum deposition of pentacene (50 nm thick, 5×$10^{-6}$ Torr 0.05 nm/s) onto Zr-SAND multilayers having four different thicknesses (Zr-SAND-1, 2, 3, and 4). To complete the TFT structure, gold S/D electrodes were vacuum-deposited (50 nm, 0.02 nm/s) through a shadow mask (L=100 μm, W=2000 μm).

Bottom-gate top-contact inorganic TFTs were fabricated using zinc tin oxide as the channel material. Zinc acetate dihydrate ($ZnAc_2$) (0.3 M) and tin chloride (II) ($SnCl_2$) (0.3 M) in a 4:6 molar ratio were dissolved in 1 mL of 2-methoxyethanol (99%, Aldrich) in a 2.5 mL capacity vial. To this solution, ethanolamine (0.3 mmol) was added to the vial and the resulting clear solutions were stirred for 30 min at room temperature before spin-coating. The zinc tin oxide precursor solution was then spin-coated at 3000 rpm for 30 s onto the dielectric/gate-substrates and annealed at 400° C. for 5 min. To complete the TFT structure, aluminum S/D electrodes were vacuum-deposited (30 nm, 1 nm/s) through a shadow mask (L=100 μm, W=2000 μm).

For this example and Example 7, TFT measurements were carried out under ambient conditions using a Signatone probestation interfaced to a Keithley 6430 Sub-Femtoamp Remote Source Meter and a Keithley 2400 source meter with a locally written LabVIEW program.

Figure 10:
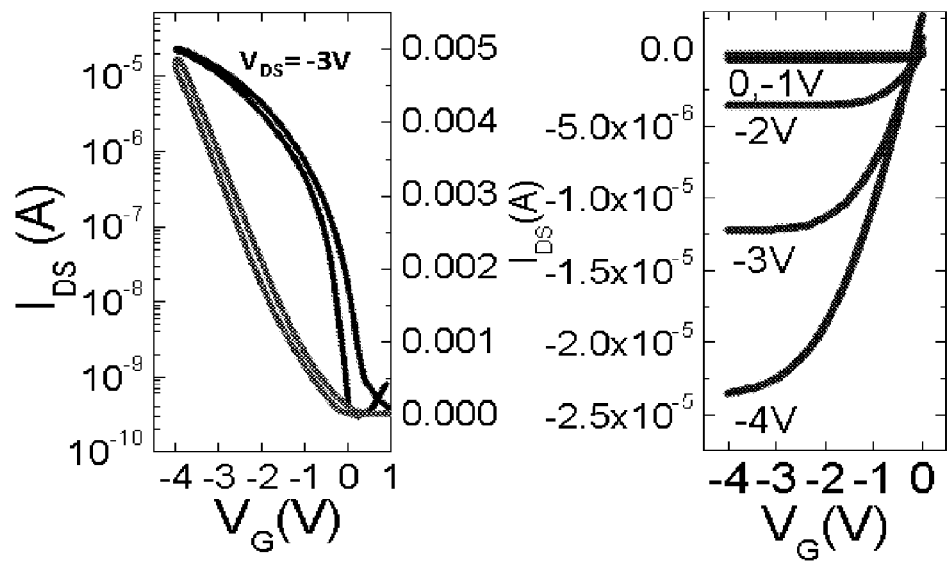
FIG. 10 shows representative transfer and output plots for pentacene OTFTs based on Zr-SAND-4.
Figure 11:
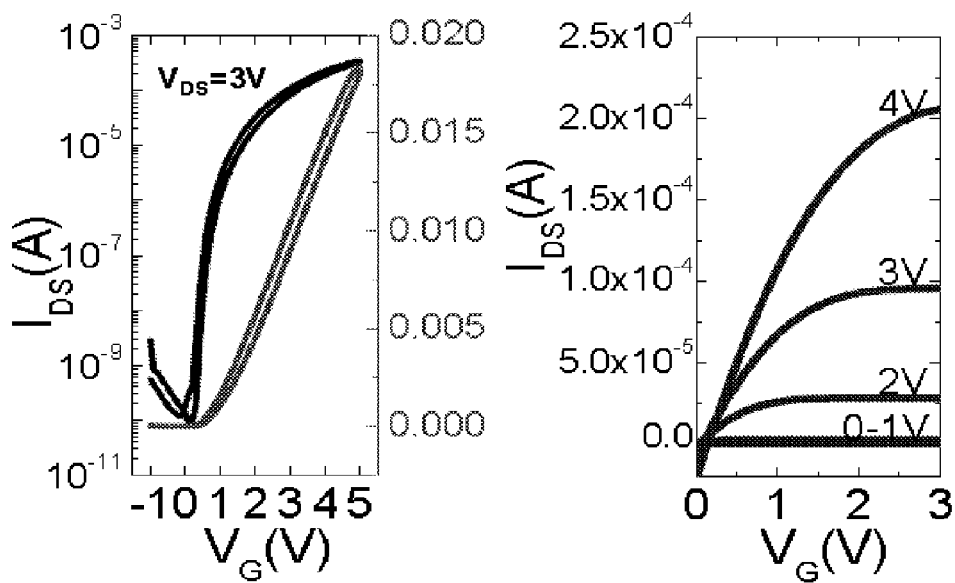
FIG. 11 shows representative transfer and output plots for zinc tin oxide TFTs based on Zr-SAND-4.

All devices exhibit reproducible I-V characteristics at low bias (<±4V). Typical I-V plots for organic and inorganic TFTs on Zr-SAND-4 are shown in FIGS. 10 and 11, respectively. Table 2 summarizes performance parameters as a function of semiconductor on Zr-SAND dielectrics having various thicknesses. Using the capacitances and device geometry (L=100 μm, and W=2000 μm) above, the P5 OTFTs devices exhibit good performance with hole mobilities of 0.35-0.38 $cm^2V^{-1}s^{-1}$, low threshold voltages (−0.5~−0.9 V), and on-off current ratios of $10^4$-$10^5$ on Zr-SAND-1 to 4. The ZTO TFTs fabricated with Zr-SAND exhibit excellent I-V characteristics with classical/crisp linear pinch-off curves and saturation at very low operating voltages (<4.0 V). Analysis of the ZTO-TFT electrical response reveals large saturation-regime field-effect mobilities of 3.0-3.5 $cm^2V^{-1}s^{-1}$, and excellent on-off current ratios of $10^5$-$10^7$. These carrier mobilities are comparable to or greater than those of control devices fabricated with a conventional 300 nm thick $SiO_2$ gate dielectric (mobility ~0.26 and 1.8 $cm^2V^{-1}s^{-1}$ for P5 and ZTO, respectively), and their operating voltages (<±4V) are much lower than on $SiO_2$ (±100V), reflecting the greater capacitance of the Zr-SANDs vs. a conventional $SiO_2$ gate dielectric. For typical operating voltages for $SiO_2$ reported in the literature, see e.g., Kim et al., *Adv. Mater.*, 19: 2561 (2007); Jeong et al., *J. Phys. Chem. C.*, 112: 11082 (2008); Kim et al., *Langmuir,* 25: 11149 (2009); and Seo et al., *Electrochem. Solid. St.,* 13: H357 (2010).

TABLE 2

Carrier Mobility (μ, $cm^2V^{-1}s^{-1}$), Threshold Voltage($V_t$), and Current On/Off Ratio ($I_{on}/I_{off}$) Data for TFT Devices Fabricated Using Pentacene and Zinc Tin Oxide as p-type Organic and n-type Inorganic Semiconductor on Zr-SAND- 1 to 4 Films

| | P5 | | | ZTO | | |
|---|---|---|---|---|---|---|
| | μ ($cm^2V^{-1}s^{-1}$) | $V_t$ | $I_{on}/I_{off}$ | μ ($cm^2V^{-1}s^{-1}$) | $V_t$ | $I_{on}/I_{off}$ |
| Zr-SAND-1 | 0.32 ± 0.02 | −0.5 | $10^4$ | 3.0 ± 0.1 | 0.9 | $10^5$ |
| Zr-SAND-2 | 0.35 ± 0.02 | −0.7 | $10^5$ | 3.3 ± 0.1 | 1.0 | $10^6$ |
| Zr-SAND-3 | 0.36 ± 0.01 | −0.8 | $10^5$ | 3.4 ± 0.1 | 1.1 | $10^7$ |
| Zr-SAND-4 | 0.38 ± 0.01 | −0.9 | $10^5$ | 3.5 ± 0.1 | 1.1 | $10^7$ |

Example 7

Fabrication and Characterization of Organic Thin-Film Transistors on Phosphonic Acid Self-Assembled Monolayer (PA-SAM)-Functionalized Zr-SAND Mutilayer Films Because hydroxyl groups present on the top $ZrO_2$ capping layer can negatively affect OTFT device performance through a combination of charge carrier surface trap sites, induced ionic polarization between charge carriers, and the high-k ionic lattice, a self-assembled monolayer (SAM) obtained with n-alkylphosphonic acids was deposited on the top capping layer of the Zr-SAND as an interlayer between the Zr-SAND multilayer and the organic semiconductor layer.

Figure 12:
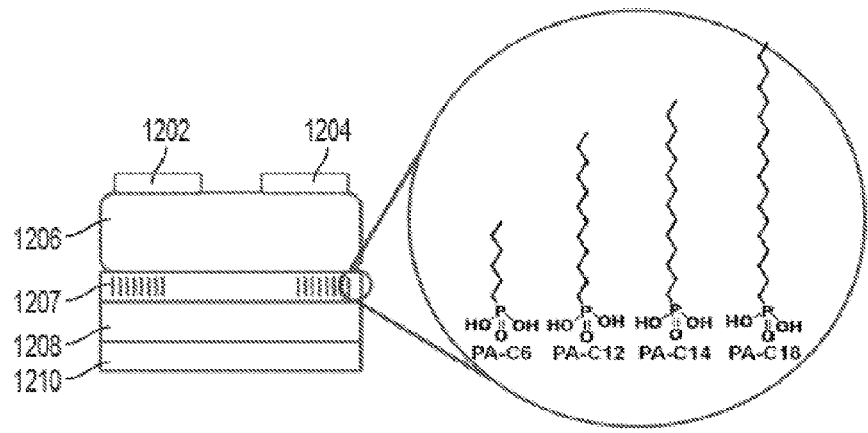
FIG. 12 shows a schematic view of a top-contact OTFT using different n-alkyl PA-SAM/Zr-SAND gate dielectrics. The inset shows the chemical structures of the n-alkyl PA-SAMs used: n-hexylphosphonic acid (PA-C6), n-dodecylphosphonic acid (PA-C12), n-tetradecylphosphonic acid (PA-C14), n-octadecylphosphonic acid (PA-C18).

To investigate the relationship between the alkyl chain length of the phosphonic acid SAMs (PA-SAMs) that coat the gate dielectric and the electrical performance characteristics of the resulting organic TFTs, OTFT devices based upon a gate dielectric composed of Zr-SAND-3, a p-type or n-type organic semiconductor, and an interlayer composed of a PA-SAM obtained from commercially available phosphonic acids with four different alkyl chain lengths were fabricated. FIG. 12 shows the structure of an exemplary OTFT device.

Specifically, bottom-gate top-contact TFTs were fabricated using pentacene (P5, p-type) or perylene diimide (PDIF-$CN_2$, n-type) as the channel material:

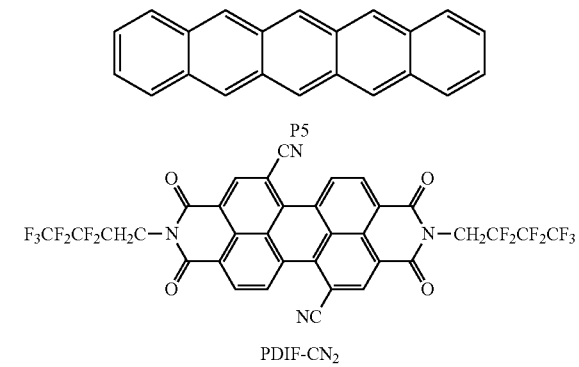

The Zr-SAND-3 film was prepared by the procedures described in Example 6. Phosphonic acid self-assembled monolayers (PA-SAMs) were prepared by immersing the Zr-SAND-3 coated substrates into solutions of 2.0 mM of four phosphonic acids having different alkyl chain lengths (Alfa Aesar) in absolute EtOH: n-hexylphosphonic acid (PA-C6, $CH_3(CH_2)_5PO(OH)_2$), n-dodecylphosphonic acid (PA-C12, $CH_3(CH_2)_{11}PO(OH)_2$), n-tetradecylphosphonic acid (PA-C14, $CH_3(CH_2)_{13}PO(OH)_2$), and n-octadecylphosphonic acid (PA-C18, $CH_3(CH_2)_{17}PO(OH)_2$). The substrates were kept in the phosphonic acid solutions at room temperature for 12 hours, followed by rinsing with EtOH, and drying under a nitrogen stream. Advancing aqueous contact angles were measured with deionized water before completion of the OTFT device structure. To form the organic semiconductor layer (50 nm thick), purified semiconductors pentacene (P5, 50 nm, $5\times10^{-6}$ Torr 0.05 nm/s) as p-type and perylene diimide (PDIF-$CN_2$, 50 nm, $5\times10^{-6}$ Torr 0.03 nm/s) as n-type semiconductor were vacuum-deposited onto each PA-SAMs treated dielectric. Gold S/D electrodes were then vacuum-deposited (50 nm, 0.02 nm/s) through a shadow mask (L=100 µm, W=2000 µm). The morphologies of the various pentacene films were evaluated by atomic force microscopy (AFM) using a JEOL-5200 scanning probe microscope with silicon cantilevers operating in the tapping mode. X-ray diffraction (XRD) patterns of pentacene thin-film (50 nm) were measured on a Rigaku ATX-G Thin-Film Diffraction Workstation using Cu Kα radiation.

Figure 13:
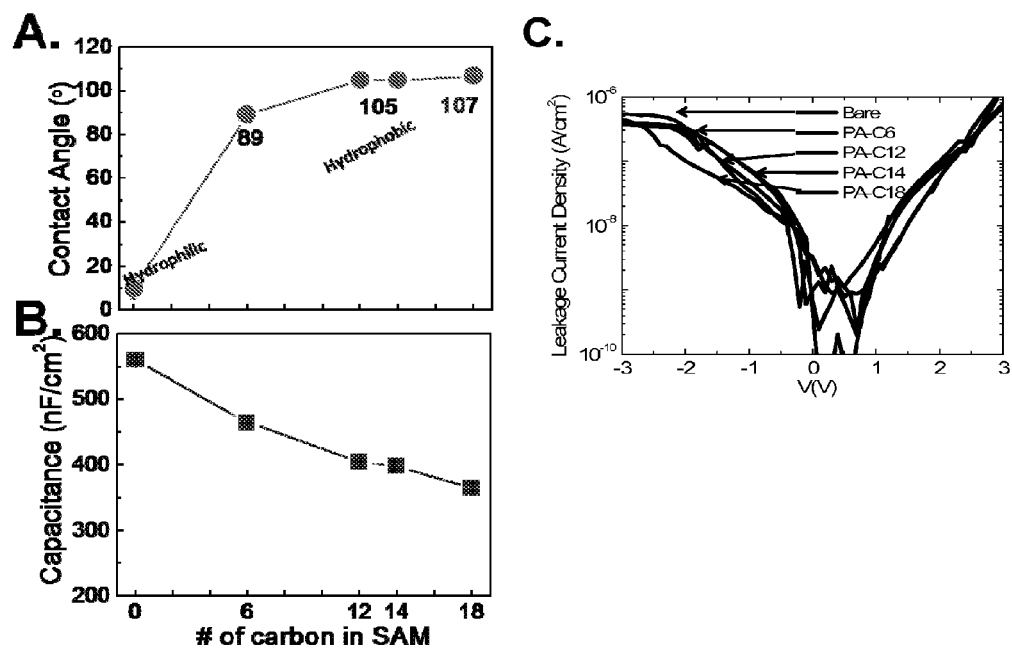
FIG. 13 shows the variations in (A) aqueous contact angle (°), (B) capacitance, and (C) leakage current densities of Zr-SAND-3 films functionalized with PA-SAMs of different alkyl chain lengths.

Advancing aqueous contact-angle measurements using deionized water show that due to n-alkyl PA-SAM formation, the $ZrO_2$ surface changes from hydrophilic (10°) to hydrophobic (89°-107°) (FIG. 13A). The slight decrease in aqueous contact angle from 105° for PA-C12 to 89° for PA-C6 can be a result of lower SAM densities on the substrate. SAMs derived from hydrocarbon chains having less than about ten carbon atoms form mostly disordered films, possibly due to a lack of cohesive van der Waals interactions between the chains. For SAM chains longer than about ten carbon atoms, the cohesive forces are expected to be sufficiently strong to force the molecules into an almost upright position, yielding dense, well-ordered monolayers, and affording large aqueous contact angles (>105°). However, it should be noted that the surface properties of all the present PA-SAM functionalized Zr-SANDs are hydrophobic, making them more compatible with most organic semiconductor molecules and polymers. Despite the additional thickness of PA-SAM, the leakage current densities of the PA-SAM/Zr-SAND-3 films are not significantly reduced at the same applied voltage (±4 V) (FIG. 13C). The decrease in capacitance observed with increased SAM alkyl chain length (FIG. 13C) from 560 nF cm$^{-2}$ for the bare Zr-SAND-3 film to 365 nF cm$^{-2}$ for PA-C18 is believed to be due to relatively low dielectric constant of the hydrocarbon chains.

Figure 14A:
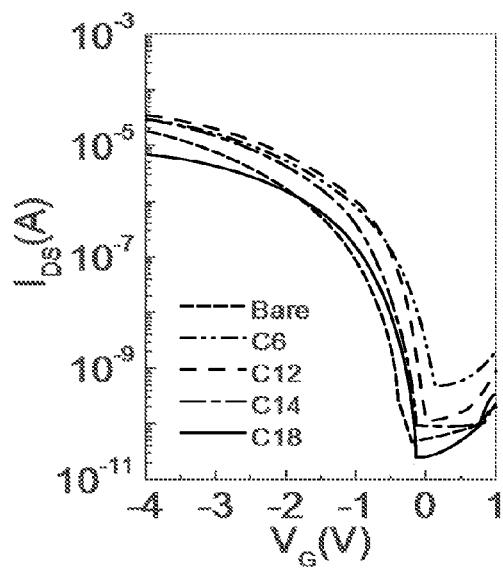
FIG. 14A shows representative transfer plots of exemplary OTFTs fabricated with a p-type semiconductor (P5) and a dielectric composed of an optionally $C_n$-PA-SAM modified Zr-SAND-3 multilayer assembly ($C_n$-PA=n-alkylphosphonic acid; $C_n$=0, 6, 12, 14 or 18). The gate voltage is swept at a constant drain-source voltage $V_{DS}=-3$ V.
Figure 15A:
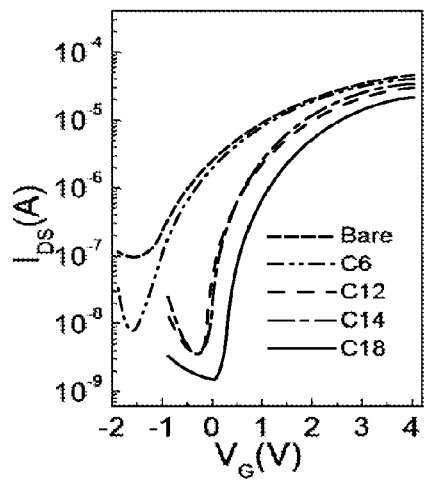
FIG. 15A shows representative transfer plots of exemplary OTFTs fabricated with an n-type semiconductor (PDIF-CN$_2$) and a dielectric composed of an optionally $C_n$-PA-SAM modified Zr-SAND-3 multilayer assembly ($C_n$-PA=n-alkylphosphonic acid; $C_n$=0, 6, 12, 14 or 18). The gate voltage is swept at a constant drain-source voltage $V_{DS}=-3$ V.
Figure 15B:
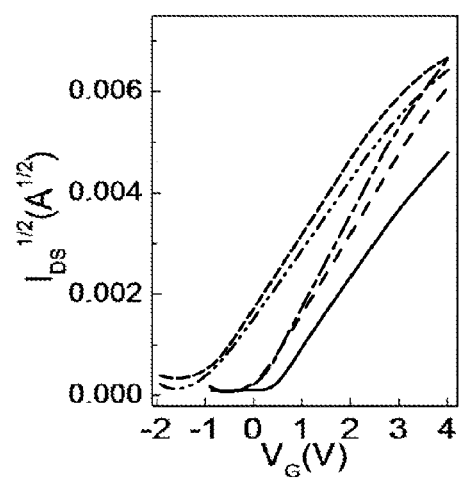
FIG. 15B shows representative $I_{DS}^{1/2}$-$V_G$ plots of exemplary OTFTs fabricated with an n-type semiconductor (PDIF-CN$_2$) and a dielectric composed of an optionally $C_n$-PA-SAM modified Zr-SAND-3 multilayer assembly ($C_n$-PA=n-alkylphosphonic acid; $C_n$=0, 6, 12, 14 or 18). The gate voltage is swept at a constant drain-source voltage $V_{DS}=-3$ V.

FIGS. 14A and 15A show representative transfer plots for OTFTs fabricated with P5 and PDIF-CN$_2$ on PA-SAMs/Zr-SAND-3. These plots exhibit reproducible I-V characteristics at low operating voltages (<±4.0 V) as well as excellent linear/saturation behavior.

Figure 14B:
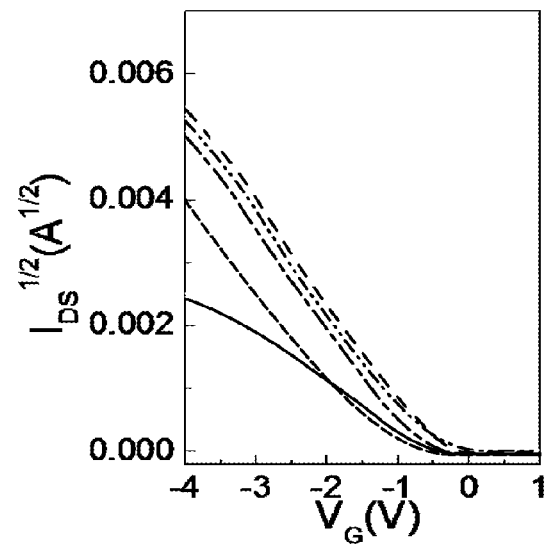
FIG. 14B shows representative $I_{DS}^{1/2}$-$V_G$ plots of exemplary OTFTs fabricated with a p-type semiconductor (P5) and a dielectric composed of an optionally $C_n$-PA-SAM modified Zr-SAND-3 multilayer assembly ($C_n$-PA=n-alkylphosphonic acid; $C_n$=0, 6, 12, 14 or 18). The gate voltage is swept at a constant drain-source voltage $V_{DS}=-3$ V.

For the P5 TFTs, FIG. 14A shows that increasing the alkyl chain length from 6 to 14 carbon atoms causes the mobility to increase from 0.61 to 0.74 cm$^2$/V s, while further increasing the chain length to 18 carbon atoms causes the mobility to drop to 0.16 cm$^2$/V s. Where no PA-SAM interlayer was used (the bare Zr-SAND sample), the mobility is only 0.36 cm$^2$/V s and therefore smaller than most of the OTFTs fabricated with PA-SAM functionalized Zr-SAND. However, all of the devices (bare or PA-SAM functionalized) exhibit excellent on-off current ratios (up to 10$^5$). FIG. 14B and Table 3 show that the threshold voltages ($V_t$) decrease from −1.0 V for P5-TFTs on bare Zr-SAND to −0.5 V for TFTs with PA-SAMs. Without wishing to be bound to any particular theory, both the increase in mobility and the decrease in threshold voltages when comparing the PA-SAM functionalized Zr-SAND substrates to bare Zr-SAND substrates can be explained as follows. The threshold voltage is closely related to the charge state at the organic semiconductor channel/gate dielectric interface as long as the entire semiconductor channel films contain about the same density of deep level defects. Therefore, the threshold voltage depends strongly on the preparation of the surface on which the organic semiconductor is deposited. In general, SAM deposition before growing the organic semiconductor layers is likely to eliminate trap states on the dielectric surface. Consequently, compared with bare Zr-SAND substrate, the PA-SAM functionalized surfaces should provide lower trap state densities, resulting in lower threshold voltages and higher TFT mobilities.

N-type organic transistors fabricated with PDIF-CN$_2$, also operating at low voltages (<4.0 V), exhibit an increase in electron mobilities as the PA alkyl chain length is increased from C6 to C14, but then fall slightly for the longest chain length (C18). Each of the PA-SAM functionalized Zr-SAND devices show significantly better performance than the bare Zr-SAND devices. The on/off ratios are enhanced by ~100× with the PA-SAMs and the threshold voltage shifts to positive (0.01V) from negative (−1.2 V) as the PA-SAM chain length is increased. Table 3 summarizes the device performance of the various OTFTs investigated.

TABLE 3

Carrier Mobility (µ, cm$^2$V$^{-1}$s$^{-1}$), Threshold Voltage($V_t$), and Current On/Off Ratio ($I_{on}/I_{off}$) data for TFT Devices Fabricated Using Pentacene and PDIF-CN$_2$ as representative p- and n-type Organic Semiconductor on PA-SAMs/Zr-SAND-3.

| | | | P5 | | | PDIF-CN$_2$ | | |
|---|---|---|---|---|---|---|---|---|
| | CA | $C_i$ | µ | $V_t$ | $I_{on}/I_{off}$ | µ | $V_t$ | $I_{on}/I_{off}$ |
| Zr-SAND-3 | <10 | 560 | 0.36 | −1.0 | 10$^5$ | 0.36 | −1.2 | 10$^2$ |
| PA-C6 | 89 | 465 | 0.61 | −0.7 | 10$^5$ | 0.41 | −1.0 | 10$^3$ |
| PA-C12 | 105 | 405 | 0.74 | −0.6 | 10$^6$ | 0.63 | 0.02 | 10$^4$ |
| PA-C14 | 105 | 398 | 0.68 | −0.8 | 10$^6$ | 0.79 | 0.01 | 10$^4$ |
| PA-C18 | 107 | 365 | 0.16 | −0.5 | 10$^5$ | 0.64 | 0.3 | 10$^4$ |

Because OTFT charge transport is confined to the nanoscopic region at the semiconductor/dielectric interface, an optimized interface between the dielectric film and the semiconductor is critical for optimum OTFT performance. The performance of P5-based TFTs, in particular, is heavily influenced by their interfacial properties which are closely related to the morphology and microstructure of the P5 thin films. As observed in this Example, P5 TFT characteristics appear to depend significantly on the SAM alkyl chain lengths. In this study, PA-C12 or PA-C14 was observed to provide optimum performance for the P5 semiconductor films.

Figure 16:
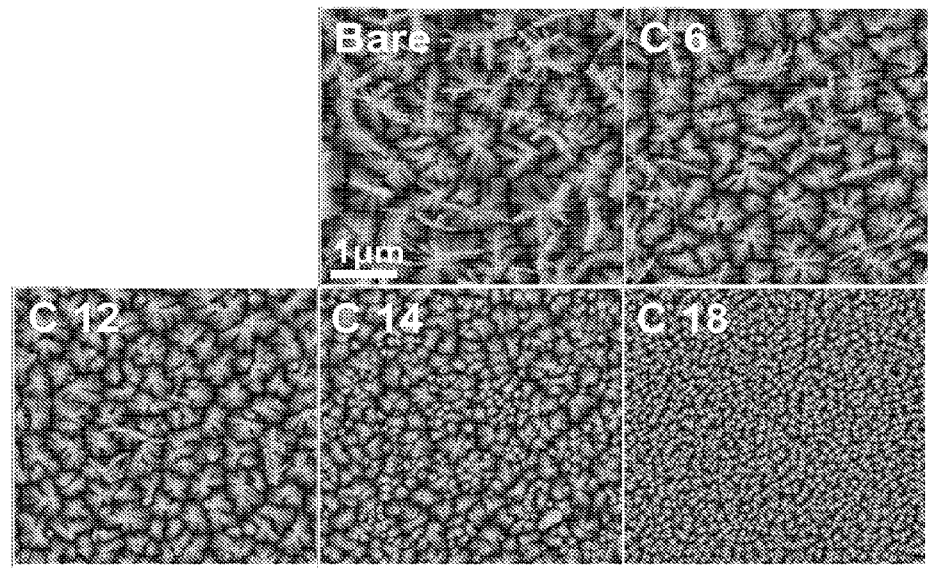
FIG. 16 shows (A) AFM images and (B) θ-2θ X-ray diffraction patterns of P5 films grown on Zr-SAND-3 treated with the indicated PA-SAMs. AFM images are of areas 5 μm×5 μm in size.
Figure 16:
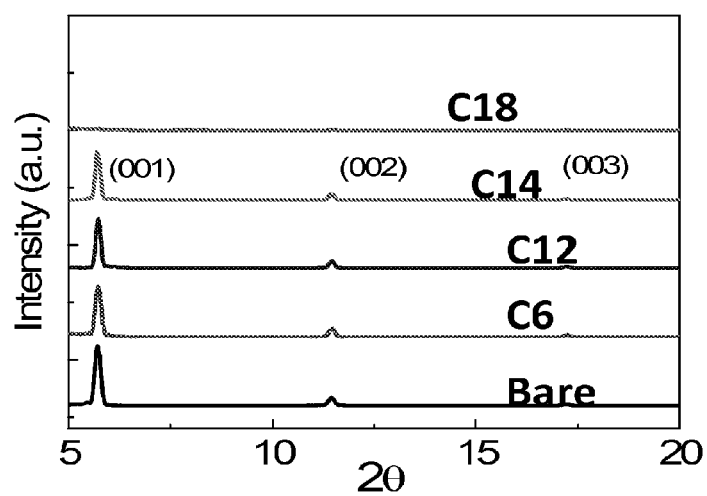

The morphology and crystallinity of P5 thin-films were evaluated by atomic force microscopy (AFM) and X-ray diffraction (XRD), respectively. FIG. 16 compares the P5 grain size and crystallinity of P5 films grown on bare Zr-SAND-3, and on PA-C6, C12, C14, and C18/Zr-SAND-3. According to these data, the grain sizes of the P5 thin films (approximately 1 µm) decrease slightly from bare Zr-SAND-3 to PA-C12, and then drop to ~0.5 µm on PA-C14 coated Zr-SAND-3. Eventually, the crystallite dimensions become very small (less than 0.1 µm) on the PA-C18/Zr-SAND-3. On PA-C14/Zr-SAND-3, the P5 film has a grain size of approximately 0.5±0.1 µm, which is significantly larger than in films on PA-C18/Zr-SAND-3. FIG. 16B shows the XRD patterns of the P5 films grown on PA-SAMs/Zr-SAND-3. The XRD data for P5 films on PA-SAMs/Zr-SAND-3 feature a distinctive first-order reflection located at 2θ=5.7°. Three characteristic features arising from the (001) Bragg planes of the thin-film phase dominate the XRD patterns. These films on bare Zr-SAND-3 and on Zr-SAND-3 coated with PA-C6, PA-C12, and PA-C14 are highly crystalline since the first reflection is sharp and intense. In contrast, P5 films grown on PA-C18 are far less textured.

Figure 17:
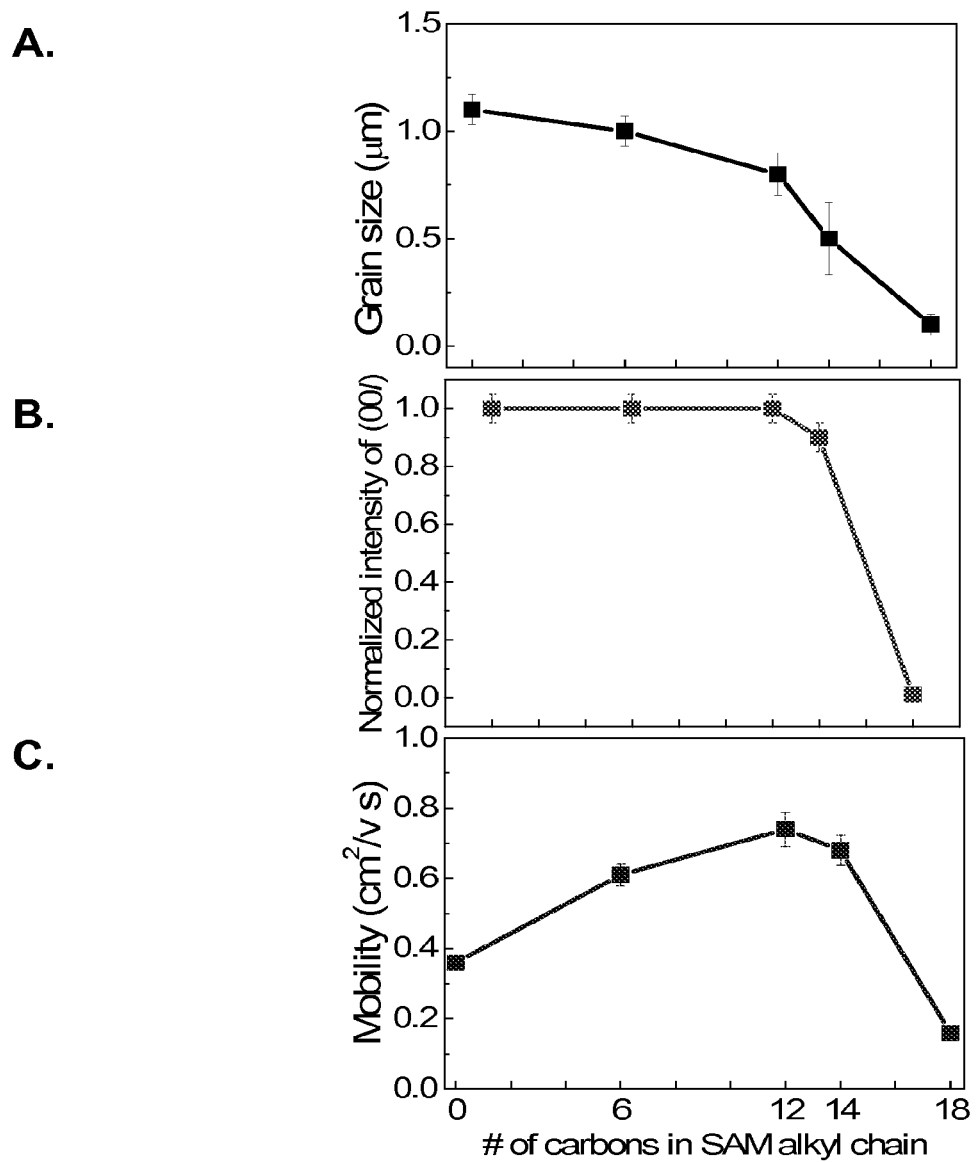
FIG. 17 shows the (A) grain size, (B) relative crystallinity, and (C) mobility trends of the P5 films grown on bare Zr-SAND-3, and on Zr-SAND-3 coated with PA-C6, PA-C12, PA-C14, and PA-C18.

Data reported in Table 3 show that device performance generally improves by functionalizing the Zr-SAND-3 with PA-SAMs. Even though the grain size of the P5 films is reduced somewhat compared to the bare Zr-SAND-3 substrate, the presence of the SAMs appears to have enhanced the quality of the OSC/dielectric interface. Particularly, the lower $V_t$ and higher μ values observed for most n-alkyl PA-SAMs versus bare Zr-SAND-3 is consistent with the suppression of any adverse effects of the high-k dielectric surface on device performance by reduction of —OH trap sites on the surface. When comparing TFT results between the different n-alkyl PA-SAMs, there are distinctive differences, particularly in mobility. Furthermore, there are systematic trends that are observed in μ when comparing PA-C12, PA-C14, and PA-C18/Zr-SAND-3 (FIG. 17). For example, as the number of carbon atoms of the SAM alkyl chain is increased from C12 to C18, the relative P5 XRD diffraction intensities decrease and the grain sizes also decline, resulting in clear degradation of μ from 0.74 to 0.16 cm²/Vs. For the P5 thin films on PA-C18, the grain size and XRD intensity fall significantly, resulting in very poor TFT performance. This trend is expected since it is known that, in general, small grain sizes and reduced film crystallinity depress μ due to drastically increased grain boundary densities.

The OTFT performance with PDIF-CN$_2$ shows generally similar behavior to the P5 TFTs (Table 3). TFT mobilities with the SAM-modified Zr-SAND are substantially enhanced versus those on the bare Zr-SAND surface and on/off ratios are enhanced by 100× with the PA-SAMs. AFM and XRD data reveal similar PDIF-CN$_2$ morphologies for SAM-coated Zr-SAND versus bare Zr-SAND. However, in terms of the threshold voltage, large shifts to positive (0.01V) from negative (−1.2 V) voltages are observed as the PA-SAM chain length is increased. The systematic PA-SAM chain length increases result in substantially increased electron carrier density in the transistor channel, inducing an abrupt shift in the threshold voltage towards more positive values.

Example 8

Comparison of PAE-ZrO$_2$ Bilayer SAND (Zr-SAND) Versus PAE-ZrP Bilayer SAND (p-SAND)

This example demonstrates the advantages of using zirconia as the inorganic material in the present organic-inorganic hybrid SAND multilayer comparing to a similar hybrid SAND multilayer where the inorganic layer is composed of zirconia phosphonate (p-SAND). In the p-SAND multilayer, the PAE-ZrP interlayer bonding is based on the insoluble, layered salts formed by organic phosphonic acids with Zr$^{4+}$ and other metal ions.

The p-SAND multilayer was prepared as follows. Clean, heavily doped n-type silicon surfaces were immersed in a CH$_3$CN solution of 0.2 M POCl$_3$-0.2 M collidine at 25° C. for 18 h, rinsed with DI water, zirconated in a 5 mM aqueous ZrOCl$_2$ solution at room temperature for 2 h, and finally rinsed again with DI water to complete the ZrP primer layer. Next, the primer layer coated substrate was immersed in a 3 mM MeOH solution of the phosphonic acid-based π-electron (PAE) reagent at 60° C. for 2 h and rinsed with MeOH; the capping zirconium phosphonate layer was then applied in two steps as with the primer layer, i.e., immersion in a POCl$_3$ solution, and after rinsing, immersion in a ZrOCl$_2$ solution.

Comparing the above procedures with the procedures for preparing Zr-SAND multilayers described in Example 2, the Zr-SAND preparation is much simpler (given that only one spin-coating step is required) and requires less time than p-SAND.

With p-SAND, it was observed that the surface roughness increases significantly with each bilayer, making it difficult to make well-structured multilayers that include more than two PAE-ZrP bilayers.

Table 4 below compares the surface morphology of Zr-SAND versus p-SAND, the dielectric properties of MIS structures based on the two multilayers, and the device performance of organic (P5) and inorganic (ZTO) TFTs incorporating the two multilayers as the dielectric.

TABLE 4

Comparison of Zr-SAND versus p-SAND.

| | Zr-SAND | p-SAND |
|---|---|---|
| Leakage current density (A/cm² at 2 V) | 1 × 10$^{-6}$ (Zr-SAND-1) 4 × 10$^{-7}$ (Zr-SAND-2) 3 × 10$^{-7}$ (Zr-SAND-3) 1 × 10$^{-7}$ (Zr-SAND-4) | 1 × 10$^{-3}$ to 1 × 10$^{-5}$ (1p-SAND) 1 × 10$^{-5}$ to 1 × 10$^{-6}$ (2p-SAND) |
| Capacitance (nF/cm²) | 750 (Zr-SAND-1) 633 (Zr-SAND-2) 535 (Zr-SAND-3) 465 (Zr-SAND-4) | 700 (1p-SAND) 520 (2p-SAND) |
| Surface roughness (nm) | 0.15 (Zr-SAND-1) 0.25 (Zr-SAND-2) 0.36 (Zr-SAND-3) 0.40 (Zr-SAND-4) | 0.6 (1p-SAND) 0.9 (2p-SAND) |
| Organic TFT (P5) | μ = 0.36 cm²V$^{-1}$s$^{-1}$; $I_{on}/I_{off}$~10$^5$ | μ = 0.1-0.27 cm²V$^{-1}$s$^{-1}$; $I_{on}/I_{off}$~10$^3$-10$^4$ |
| Inorganic TFT (ZTO) | μ = 3.5 cm²V$^{-1}$s$^{-1}$; $I_{on}/I_{off}$~10$^7$ | Not thermally stable |

The present teachings encompass embodiments in other specific forms without departing from the spirit or essential characteristics thereof. The foregoing embodiments are therefore to be considered in all respects illustrative rather than limiting on the present teachings described herein. Scope of the present invention is thus indicated by the appended claims rather than by the foregoing description, and all changes that come within the meaning and range of equivalency of the claims are intended to be embraced therein.

What is claimed is:

1. A method of fabricating a thin film transistor comprising an organic-inorganic hybrid multilayer dielectric material, a gate electrode in contact with the organic-inorganic hybrid multilayer dielectric material, a thin film semiconductor, and source and drain electrodes in contact with the thin film semiconductor, wherein the organic-inorganic hybrid multilayer dielectric material comprises an inorganic primer layer and one or more bilayers deposited thereon, each bilayer comprising a π-polarizable layer and an inorganic oxide capping layer, wherein the inorganic oxide capping layer in each bilayer is coupled to the π-polarizable layer via bonds other than phosphonate bonds, the method comprising:
    assembling the organic-inorganic hybrid multilayer dielectric material by performing one or more times the steps of (a) coupling a π-polarizable layer to either an existing inorganic primer layer or an existing inorganic oxide capping layer; and (b) coupling a new inorganic oxide capping layer to the π-polarizable layer via bonds other than phosphonate bonds;
    depositing a thin film semiconductor either directly adjacent to the organic-inorganic hybrid multilayer dielectric material or indirectly adjacent to the organic-inorganic hybrid multilayer dielectric material via an interlayer;
    forming source and drain electrodes in contact with the thin film semiconductor; and
    providing a gate electrode in contact with the organic-inorganic hybrid multilayer dielectric material.
2. The method of claim 1, wherein coupling the new inorganic oxide capping layer to the π-polarizable layer comprises contacting the π-polarizable layer with a zirconia sol.

3. The method of claim 2, wherein the zirconia sol comprises a zirconium compound in an alcohol solvent or a solvent mixture comprising an alcohol.

4. The method of claim 3, wherein the zirconium compound is selected from $ZrCl_4$, $ZrOCl_2$, and $Zr(OR)_4$, wherein each R independently is a $C_{1-6}$ alkyl group.

5. The method of claim 1, wherein coupling the new inorganic oxide capping layer to the π-polarizable layer comprises spin-coating a zirconia sol on the π-polarizable layer and annealing at a temperature between about 100° C. and about 400° C.

6. The method of claim 1, comprising forming an inorganic primer layer on a substrate and coupling one of the π-polarizable layers to the inorganic primer layer.

7. The method of claim 6, wherein forming the inorganic primer layer on the substrate comprises spin-coating a zirconia sol on the substrate and annealing at a temperature between about 100° C. and about 400° C.

8. The method of claim 1, comprising performing steps (a) and (b) two or more times.

9. The method of claim 1, wherein the organic-inorganic hybrid multilayer dielectric material is assembled on the gate electrode.

10. The method of claim 1, wherein the thin film semiconductor comprises an organic compound selected from the group consisting of a semiconducting molecule and a semiconducting polymer.

11. The method of claim 10, wherein the organic compound comprises fused heterocycles, aromatic hydrocarbons, polythiophenes, or fused heteroaromatics.

12. The method of claim 10, wherein the thin film semiconductor is deposited by vapor deposition, spin-coating, or printing.

13. The method of claim 10 comprising assembling a monolayer between the organic-inorganic hybrid multilayer dielectric material and the thin film semiconductor.

14. The method of claim 13, wherein the monolayer is prepared with an n-alkylphosphonic acid precursor.

15. The method of claim 1, wherein the thin film semiconductor comprises a semiconducting metal oxide selected from the group consisting of indium oxide ($In_2O_3$), indium zinc oxide (IZO), zinc tin oxide (ZTO), indium gallium oxide (IGO), indium-gallium-zinc oxide (IGZO), tin oxide ($SnO_2$), and zinc oxide (ZnO).

16. The method of claim 15, wherein the thin film semiconductor is deposited by a solution-phase method.

* * * * *